(12) United States Patent
Ziegler et al.

(10) Patent No.: US 7,834,613 B2
(45) Date of Patent: Nov. 16, 2010

(54) ISOLATED CURRENT TO VOLTAGE, VOLTAGE TO VOLTAGE CONVERTER

(75) Inventors: Silvio Ziegler, Greenwood (AU); Peter Gammenthaler, Hittnau (CH); Alain Chapuis, Riedikon (CH)

(73) Assignee: Power-One, Inc., Camarillo, CA (US)

( * ) Notice: Subject to any disclaimer, the term of this patent is extended or adjusted under 35 U.S.C. 154(b) by 74 days.

(21) Appl. No.: 12/115,452

(22) Filed: May 5, 2008

(65) Prior Publication Data

US 2009/0108833 A1 Apr. 30, 2009

Related U.S. Application Data

(60) Provisional application No. 60/983,884, filed on Oct. 30, 2007.

(51) Int. Cl.
*G01R 15/20* (2006.01)
*G01R 15/18* (2006.01)
(52) U.S. Cl. .................. 324/127; 324/117 R
(58) Field of Classification Search ........ None
See application file for complete search history.

(56) References Cited

U.S. PATENT DOCUMENTS

| | | | |
|---|---|---|---|
| 3,660,672 A | 5/1972 | Berger et al. | |
| 4,021,729 A * | 5/1977 | Hudson, Jr. ............. | 324/509 |
| 4,147,171 A * | 4/1979 | Greene et al. .......... | 607/46 |
| 4,194,147 A | 3/1980 | Payne et al. | |
| 4,204,249 A | 5/1980 | Dye et al. | |
| 4,328,429 A | 5/1982 | Kublick et al. | |
| 4,335,445 A | 6/1982 | Nercessian | |
| 4,350,943 A | 9/1982 | Pritchard | |
| 4,451,773 A | 5/1984 | Papathomas et al. | |
| 4,538,073 A | 8/1985 | Freige et al. | |
| 4,538,101 A | 8/1985 | Shimpo et al. | |
| 4,607,330 A | 8/1986 | McMurray et al. | |

(Continued)

FOREIGN PATENT DOCUMENTS

CN 2521825 11/2002

(Continued)

OTHER PUBLICATIONS

The I2C-Bus Specification, Version 2.1, Jan. 1, 2000; Document Order No. 9398 393 40011, pp. 1-46.

(Continued)

*Primary Examiner*—Paresh Patel
(74) *Attorney, Agent, or Firm*—O'Melveny & Meyers LLP

(57) ABSTRACT

A current sensor is provided that employs a primary winding that carries the current to be measured, and a secondary winding that controls the flux inside the magnetic core, provides a sample of the primary current, and also helps to control the flux at small primary currents and to saturate the transformer. An auxiliary winding is optionally used to control the flux in order to simplify control of the sensor. By periodically applying a certain voltage at the secondary winding, the transformer core is forced out of saturation, and a sample of the primary current is taken by a sensing circuit that may include a sample-and-hold circuit and an analog-to-digital converter. A control circuit is employed to control the currents flowing in the secondary winding and optional auxiliary winding and to manage the sensing circuit.

36 Claims, 12 Drawing Sheets

U.S. PATENT DOCUMENTS

| | | | |
|---|---|---|---|
| 4,616,142 A | 10/1986 | Upadhyay et al. |
| 4,622,627 A | 11/1986 | Rodriguez et al. |
| 4,630,187 A | 12/1986 | Henze |
| 4,654,769 A | 3/1987 | Middlebrook |
| 4,677,566 A | 6/1987 | Whittaker et al. |
| 4,761,725 A | 8/1988 | Henze |
| 4,940,930 A | 7/1990 | Detweiler |
| 4,988,942 A | 1/1991 | Ekstrand |
| 5,004,972 A | 4/1991 | Roth |
| 5,053,920 A | 10/1991 | Staffiere et al. |
| 5,073,848 A | 12/1991 | Steigerwald et al. |
| 5,079,498 A | 1/1992 | Cleasby et al. |
| 5,117,430 A | 5/1992 | Berglund |
| 5,168,208 A | 12/1992 | Schultz et al. |
| 5,229,699 A | 7/1993 | Chu et al. |
| 5,270,904 A | 12/1993 | Gulczynski |
| 5,272,614 A | 12/1993 | Brunk et al. |
| 5,287,055 A | 2/1994 | Cini et al. |
| 5,325,062 A * | 6/1994 | Bachand et al. ............. 324/537 |
| 5,349,523 A | 9/1994 | Inou et al. |
| 5,377,090 A | 12/1994 | Steigerwald |
| 5,398,029 A | 3/1995 | Toyama et al. |
| 5,426,425 A | 6/1995 | Conrad et al. |
| 5,440,520 A | 8/1995 | Schutz et al. |
| 5,481,140 A | 1/1996 | Maruyama et al. |
| 5,489,904 A | 2/1996 | Hadidi |
| 5,508,606 A | 4/1996 | Ryczek |
| 5,532,577 A | 7/1996 | Doluca |
| 5,610,826 A | 3/1997 | Whetsel |
| 5,627,460 A | 5/1997 | Bazinet et al. |
| 5,631,550 A | 5/1997 | Castro et al. |
| 5,646,509 A | 7/1997 | Berglund et al. |
| 5,675,480 A | 10/1997 | Stanford |
| 5,684,686 A | 11/1997 | Reddy |
| 5,727,208 A | 3/1998 | Brown |
| 5,752,047 A | 5/1998 | Darty et al. |
| 5,815,018 A | 9/1998 | Soborski |
| 5,847,950 A | 12/1998 | Bhagwat |
| 5,870,296 A | 2/1999 | Schaffer |
| 5,872,984 A | 2/1999 | Berglund et al. |
| 5,874,912 A | 2/1999 | Hasegawn |
| 5,883,797 A | 3/1999 | Amaro et al. |
| 5,889,392 A | 3/1999 | Moore et al. |
| 5,892,933 A | 4/1999 | Voltz |
| 5,905,370 A | 5/1999 | Bryson |
| 5,917,719 A | 6/1999 | Hoffman et al. |
| 5,929,618 A | 7/1999 | Boylan et al. |
| 5,929,620 A | 7/1999 | Dobkin et al. |
| 5,935,252 A | 8/1999 | Berglund et al. |
| 5,943,227 A | 8/1999 | Bryson et al. |
| 5,946,495 A | 8/1999 | Scholhamer et al. |
| 5,990,669 A | 11/1999 | Brown |
| 5,994,885 A | 11/1999 | Wilcox et al. |
| 6,005,377 A | 12/1999 | Chen et al. |
| 6,021,059 A | 2/2000 | Kennedy |
| 6,055,163 A | 4/2000 | Wagner et al. |
| 6,057,607 A | 5/2000 | Rader, III et al. |
| 6,079,026 A | 6/2000 | Berglund et al. |
| 6,100,676 A | 8/2000 | Burstein et al. |
| 6,111,396 A | 8/2000 | Lin et al. |
| 6,115,441 A | 9/2000 | Douglass et al. |
| 6,121,760 A | 9/2000 | Marshall et al. |
| 6,136,143 A | 10/2000 | Winter et al. |
| 6,137,280 A | 10/2000 | Ackermann |
| 6,150,803 A | 11/2000 | Varga |
| 6,157,093 A | 12/2000 | Giannopoulos et al. |
| 6,157,182 A | 12/2000 | Tanaka et al. |
| 6,160,697 A | 12/2000 | Edel |
| 6,163,143 A | 12/2000 | Shimamori |
| 6,163,178 A | 12/2000 | Stark et al. |
| 6,170,062 B1 | 1/2001 | Henrie |
| 6,177,787 B1 | 1/2001 | Hobrecht |
| 6,181,029 B1 | 1/2001 | Berglund et al. |
| 6,191,566 B1 | 2/2001 | Petricek et al. |
| 6,194,856 B1 | 2/2001 | Kobayashi et al. |
| 6,194,883 B1 | 2/2001 | Shimamori |
| 6,198,261 B1 | 3/2001 | Schultz et al. |
| 6,199,130 B1 | 3/2001 | Berglund et al. |
| 6,208,127 B1 | 3/2001 | Doluca |
| 6,211,579 B1 | 4/2001 | Blair |
| 6,246,219 B1 | 6/2001 | Lynch et al. |
| 6,249,111 B1 | 6/2001 | Nguyen |
| 6,262,900 B1 | 7/2001 | Suntio |
| 6,288,595 B1 | 9/2001 | Hirakata et al. |
| 6,291,975 B1 | 9/2001 | Snodgrass |
| 6,294,954 B1 | 9/2001 | Melanson |
| 6,304,066 B1 | 10/2001 | Wilcox et al. |
| 6,304,823 B1 | 10/2001 | Smit et al. |
| 6,320,768 B1 | 11/2001 | Pham et al. |
| 6,351,108 B1 | 2/2002 | Burnstein et al. |
| 6,355,990 B1 | 3/2002 | Mitchell |
| 6,366,069 B1 | 4/2002 | Nguyen et al. |
| 6,370,047 B1 | 4/2002 | Mallory |
| 6,373,334 B1 | 4/2002 | Melanson |
| 6,385,024 B1 | 5/2002 | Olson |
| 6,392,577 B1 | 5/2002 | Swanson et al. |
| 6,396,169 B1 | 5/2002 | Voegli |
| 6,396,250 B1 | 5/2002 | Bridge |
| 6,400,127 B1 | 6/2002 | Giannopoulos |
| 6,411,071 B1 | 6/2002 | Schultz et al. |
| 6,411,072 B1 | 6/2002 | Feldman |
| 6,414,864 B1 | 7/2002 | Hoshi |
| 6,421,259 B1 | 7/2002 | Brooks et al. |
| 6,429,630 B2 | 8/2002 | Pohlman et al. |
| 6,448,745 B1 | 9/2002 | Killat |
| 6,448,746 B1 | 9/2002 | Carlson |
| 6,456,044 B1 | 9/2002 | Darmawaskita |
| 6,465,909 B1 | 10/2002 | Soo et al. |
| 6,465,993 B1 | 10/2002 | Clarkin et al. |
| 6,469,478 B1 | 10/2002 | Curtin |
| 6,469,484 B2 | 10/2002 | L'Hermite et al. |
| 6,476,589 B2 | 11/2002 | Umminger et al. |
| 6,556,158 B2 | 4/2003 | Steensgaard-Madsen |
| 6,559,684 B2 | 5/2003 | Goodfellow |
| 6,563,294 B2 | 5/2003 | Duffy et al. |
| 6,583,608 B2 | 6/2003 | Zafarana et al. |
| 6,590,369 B2 | 7/2003 | Burstein et al. |
| 6,608,402 B2 | 8/2003 | Soo et al. |
| 6,614,612 B1 | 9/2003 | Menegoli et al. |
| 6,621,259 B2 | 9/2003 | Jones et al. |
| 6,651,178 B1 | 11/2003 | Voegeli et al. |
| 6,665,525 B2 | 12/2003 | Dent et al. |
| 6,683,494 B2 | 1/2004 | Stanley |
| 6,686,831 B2 | 2/2004 | Cook |
| 6,693,811 B1 | 2/2004 | Bowman et al. |
| 6,717,389 B1 | 4/2004 | Johnson |
| 6,731,023 B2 | 5/2004 | Rothleitner et al. |
| 6,744,243 B2 | 6/2004 | Daniels et al. |
| 6,771,052 B2 | 8/2004 | Ostojic |
| 6,778,414 B2 | 8/2004 | Chang et al. |
| 6,788,033 B2 | 9/2004 | Vinciarelli |
| 6,788,035 B2 | 9/2004 | Bassett et al. |
| 6,791,298 B2 | 9/2004 | Shenai et al. |
| 6,791,302 B2 | 9/2004 | Tang et al. |
| 6,791,368 B2 | 9/2004 | Tzeng et al. |
| 6,795,009 B2 | 9/2004 | Duffy et al. |
| 6,801,027 B2 | 10/2004 | Hann et al. |
| 6,807,070 B2 | 10/2004 | Ribarich |
| 6,816,758 B2 | 11/2004 | Maxwell, Jr. et al. |
| 6,819,537 B2 | 11/2004 | Pohlman et al. |
| 6,825,644 B2 | 11/2004 | Kernahan et al. |
| 6,828,765 B1 | 12/2004 | Schultz et al. |
| 6,829,547 B2 | 12/2004 | Law et al. |
| 6,833,691 B2 | 12/2004 | Chapuis |

| | | |
|---|---|---|
| 6,850,046 B2 | 2/2005 | Chapuis |
| 6,850,049 B2 | 2/2005 | Kono |
| 6,850,426 B2 | 2/2005 | Kojori et al. |
| 6,853,169 B2 | 2/2005 | Burstein et al. |
| 6,853,174 B1 | 2/2005 | Inn |
| 6,888,339 B1 | 5/2005 | Travaglini et al. |
| 6,903,949 B2 | 6/2005 | Ribarich |
| 6,911,808 B1 | 6/2005 | Shimamori |
| 6,915,440 B2 | 7/2005 | Berglund et al. |
| 6,917,186 B2 | 7/2005 | Klippel et al. |
| 6,928,560 B1 | 8/2005 | Fell, III et al. |
| 6,933,709 B2 | 8/2005 | Chapuis |
| 6,933,711 B2 | 8/2005 | Sutardja et al. |
| 6,936,999 B2 | 8/2005 | Chapuis |
| 6,947,273 B2 | 9/2005 | Bassett et al. |
| 6,949,916 B2 | 9/2005 | Chapuis |
| 6,963,190 B2 | 11/2005 | Asanuma et al. |
| 6,965,220 B2 | 11/2005 | Kernahan et al. |
| 6,965,502 B2 | 11/2005 | Duffy et al. |
| 6,975,494 B2 | 12/2005 | Tang et al. |
| 6,975,785 B2 | 12/2005 | Ghandi |
| 6,977,492 B2 | 12/2005 | Sutardja et al. |
| 7,000,125 B2 | 2/2006 | Chapuis et al. |
| 7,000,315 B2 | 2/2006 | Chua et al. |
| 7,002,265 B2 | 2/2006 | Potega |
| 7,007,176 B2 | 2/2006 | Goodfellow et al. |
| 7,023,192 B2 | 4/2006 | Sutardja et al. |
| 7,023,672 B2 | 4/2006 | Goodfellow et al. |
| 7,047,110 B2 | 5/2006 | Lenz et al. |
| 7,049,798 B2 | 5/2006 | Chapuis et al. |
| 7,068,021 B2 | 6/2006 | Chapuis |
| 7,080,265 B2 | 7/2006 | Thaker et al. |
| 7,141,956 B2 | 11/2006 | Chapuis |
| 7,190,754 B1 | 3/2007 | Chang et al. |
| 7,266,709 B2 | 9/2007 | Chapuis et al. |
| 7,301,313 B1 | 11/2007 | Hart et al. |
| 7,315,157 B2 | 1/2008 | Chapuis |
| 7,315,160 B2 | 1/2008 | Fosler |
| 7,359,643 B2 | 4/2008 | Aronson et al. |
| 7,394,445 B2 | 7/2008 | Chapuis et al. |
| 7,584,371 B2 | 9/2009 | Zhang |
| 2001/0052862 A1 | 12/2001 | Roelofs |
| 2002/0070718 A1 | 6/2002 | Rose |
| 2002/0073347 A1 | 6/2002 | Zafarana et al. |
| 2002/0075710 A1 | 6/2002 | Lin |
| 2002/0104031 A1 | 8/2002 | Tomlinson et al. |
| 2002/0105227 A1 | 8/2002 | Nerone et al. |
| 2002/0144163 A1 | 10/2002 | Goodfellow et al. |
| 2003/0006650 A1 | 1/2003 | Tang et al. |
| 2003/0067404 A1 | 4/2003 | Ruha et al. |
| 2003/0122429 A1 | 7/2003 | Zhang |
| 2003/0137912 A1 | 7/2003 | Ogura |
| 2003/0142513 A1 | 7/2003 | Vinciarelli |
| 2003/0201761 A1 | 10/2003 | Harris |
| 2004/0080044 A1 | 4/2004 | Moriyama et al. |
| 2004/0093533 A1 | 5/2004 | Chapuis et al. |
| 2004/0123164 A1 | 6/2004 | Chapuis et al. |
| 2004/0123167 A1 | 6/2004 | Chapuis |
| 2004/0174147 A1 | 9/2004 | Vinciarelli |
| 2004/0178780 A1 | 9/2004 | Chapuis |
| 2004/0189271 A1 | 9/2004 | Hanson et al. |
| 2004/0201279 A1 | 10/2004 | Templeton |
| 2004/0225811 A1 | 11/2004 | Fosler |
| 2004/0246754 A1 | 12/2004 | Chapuis |
| 2005/0093594 A1 | 5/2005 | Kim et al. |
| 2005/0117376 A1 | 6/2005 | Wilson |
| 2005/0146312 A1 | 7/2005 | Kenny et al. |
| 2005/0200344 A1 | 9/2005 | Chapuis |
| 2005/0289373 A1 | 12/2005 | Chapuis et al. |
| 2006/0022656 A1 | 2/2006 | Leung et al. |
| 2006/0085656 A1 | 4/2006 | Betts-LaCroix |
| 2006/0149396 A1 | 7/2006 | Templeton |
| 2006/0174145 A1 | 8/2006 | Chapuis et al. |
| 2006/0244570 A1 | 11/2006 | Leung et al. |
| 2006/0250120 A1 | 11/2006 | King |
| 2007/0114985 A1 | 5/2007 | Latham et al. |
| 2008/0074373 A1 | 3/2008 | Chapuis et al. |
| 2008/0238208 A1 | 10/2008 | Potter et al. |

FOREIGN PATENT DOCUMENTS

| | | |
|---|---|---|
| EP | 0255258 | 2/1988 |
| EP | 0315366 | 5/1989 |
| EP | 0401562 | 12/1990 |
| EP | 0660487 | 6/1995 |
| EP | 0875994 | 11/1998 |
| EP | 0877468 | 11/1998 |
| EP | 0997825 | 5/2000 |
| GB | 2377094 | 12/2002 |
| JP | 60-244111 | 12/1985 |
| JP | 1185329 | 3/1999 |
| JP | 11-289754 | 10/1999 |
| KR | 200284495 | 8/2002 |
| RU | 1814177 | 5/1993 |
| SU | 1359874 | 12/1985 |
| WO | WO93/19415 | 9/1993 |
| WO | WO01/22585 | 3/2001 |
| WO | WO02/31943 | 4/2002 |
| WO | WO02/31951 | 4/2002 |
| WO | WO02/50690 | 6/2002 |
| WO | WO02/063688 | 8/2002 |
| WO | WO03/030369 | 4/2003 |

OTHER PUBLICATIONS

25 Watt DC-DC Converters, Melcher The Power Partners and Power-One Group of Companies, Industrial Environment, Apr. 4, 1999, DC-DC Converters <40 Watt, G Series, 16 Pages.

-48V Programmable Hot Swap Sequencing Power Controller, Summit Microelectronics, Inc., Oct. 30, 2002, SMH4804, 41 Pages.

33702 Microprocessor Power Supply (3.0A), Analog Products MC33702 Fact Sheet; Motorola/Digital dna/Power Management Switchings; Jan. 1, 2003, pp. 1-4.

Accelerator-Control-System Interface for Intelligent Power Supplies, S. Cohen, Los Alamos National Laboratory, Jan. 1, 1992, pp. 183-186.

Advanced Configuration and Power Interface Specification, Intel Corporation, Microsoft Corporation, Toshiba Corp, Feb. 2, 1999, Revision 1.0b, 387 Pages.

Advantages of Microcontrollers in DC-DC Converters, Galaxy Power, Jan. 1, 2003 IBM Symposium, Real Solutions for Distributed Power, 8 Pages.

Agilent E364xA Single Output DC Power Supplies, User's Guide; Agilent Technologies, Part No. E3640-90001, Jan. 1, 2000, 207 pages.

Agilent E3640A—E3649A Programmable dc Power Supplies, Data Sheet; Agilent Technologies, Jan. 1, 2000, 4 pages.

Architecture and IC implementation of a digital VRM controller, Jinwen, Xiao et al, 32nd Annual IEEE Power Electronics Specialists Conference. PESC 2001. Conference Proceedings. Vancouver, Canada, Jun. 17-21, 2001, Annual Power Electronics Specialists Conference, New York, NY : IEEE, US, vol. vol. 1 of 4. Conf. 32, Jun. 17, 2001, pp. 38-47, XP010559121 ISBN: 0-7803-7067-8, figure 7.

Automated Power Distribution System Hardware, Anderson et al.; Aug. 6, 1989; pp. 579-584.

Automating the Design of a Generic Modular Power System for the Global Market, Pedersen, George, Briggs, Steve; Massey, Paul, Advance Power Raynham Road, Bishops Stortford, Herts.; Jan. 1, 1999, CM23 5PF UK, (5 pages).

Auto Sequence Programming Examples for GPIB-M, Xantrex Technology, Inc., Nov. 27, 2002, 1.0a, 4 pages.

BE510 / BE510S Modules—Bipolar DC Source from 100mV to 20V and from 100nA to 4A, Innovative Test Systems; BE510 Version II, Issue 9, Nov. 12, 2000, 3 Pages.

BE52x Modules—Multi-range bipolar DC sources from 30V to 500V, 90W, Innovative Test Systems; BE52x Version A, Issue 9, Aug. 3, 2001, 3 pages.

Characteristics of Automated Power System Monitoring & Management Platforms, Hawkins, John M.; Telepower Australia Pty Ltd, Jan. 1, 2000, telepower@telepower.com.au, IEEE, Intelec, 5 Pages.
Chemistry-Independent Battery Chargers, Maxim Integrated Products, Dec. 1, 2002, 19-1158, Rev 1, MAX1647/MAX1648, 25 Pages.
The Continuing Evolution of Intelligence for Telecommunications Power Plants, Godby, Jimmy, Apr. 1, 1996, IEEE, 0-7803-3507-4/96, pp. 70-75.
Controlling and Alarming DC Power Plants via the Internet, Cosentino, Anthony P.; Sullivan, Michael C.; Baxter, Richard V. Jr.; Loeck, JonPower Conversion Products, LLC and Pensar Corporation, Jan. 1, 1998, 6 pages.
Current-Fed Multiple-Output Power Conversion, Seamus O'Driscoll; John G. Hayes and Michael G. Egan; Artesyn Technologies; Dept. of Electrical Engineering, University College Cork, Ireland, Dec. 3, 2003, 7 pages.
DALI Manual, DALI AG, Digital Addressable Lighting Interface Activity Group, ZVEI-Division Luminaires, Jan. 1, 2001, pp. 1-62.
Defendant's Artesyn Technologies, Inc.'s Preliminary Invalidity Contentions—(*Power-One, Inc.* vs. *Artesyn Technologies, Inc. et al.*), Civil Action No. 2-05-CV-463 (LED), United States District Court for the Eastern District of Texas; Apr. 26, 2006, (182 pages).
DHP Series DC Power Supplies, IEEE 488.2/RS-232 Options Programming Manual; Sorensen, Division of Elgar Electronics Corporation, Document No. M550005-01 Rev B, Jul. 29, 2002, 32 pages.
The Digital Addressable Lighting Interface (DALI): An Emerging Energy-Conserving Lighting Solution, Ronat, Odile; International Rectifier, Apr. 9, 2002, TP4/9/2002, pp. 1-6.
Digital Multiphase Power from Primarion and Intersil Changing the Landscape of Processor Power, Primarion, Inc., White Paper, Sep. 12, 2002, 6 pages.
Digitally Controlled Power Systems: How Much Intelligence is Needed and Where it Should be, Lock, Tom; RELTEC Corporation, Jan. 1, 1998, IEEE, ( 5 pages).
Digitally-Controlled SMPS Extends Power System Capabilities, Vinsant, Ron; DiFiore, John; Clarke, Richard, PCIM, Jun. 1, 1994, pp. 30-37.
A Digitally Controlled Zero-Voltage-Switched Fullbridge Converter, Rinne, Karl-Heinz; Theml, Klaus; Duigan, Joseph; McCarthy, Oliver, Power Conversion, Jun. 1, 1994 Proceedings, pp. 317-324.
Distributed Intelligence and Modular Architecture for Next Generation DC Power System, Duguay, Louis; Got, Pierre, Astec Advanced Power Systems, Quebec, Canada; Jan. 1, 2000, 6 pgs.
Distributed Power Hot Swap Controller, Summit Microelectronics, Inc., Mar. 19, 2001, SMH4804; 2050 2.3, 32 pages.
Dual 550kHz Synchronous 2-Phase Switching Regulator Controller, Linear Technology, Jan. 1, 1998, LTC1702, 36 Pages.
Dual Smart Card Interface TDA8020HL, Philips Semiconductors, Integrated Circuits, Data Sheet, Feb. 24, 2001, I2C Bus,TDA8020HL, Objective Specification v4.2 Supersedes data of Jan. 2001 File under Integrated Circuits, ICXX, 22 Pages.
Dual Smart Card Interface TDA8020HL/C2, Christophe Chausset, Philips Semiconductors, May 20, 2003, Application Note, TDA8020HL/C2, AN10232, 28 Pages.
Electronic Products Power Supply Special: Programmable Supplies Use Switch-Mode Topologies, Birman, Paul; Nercessian, Sarkis; Kepco, Inc. Flushing NY; vol. 37, No. 10, Electronic Products, Mar. 1, 1995; The Engineer's Magazine of Product Technology; Power Supply Special; DSO Samples Single Shots at 10 Gsamples/s Speech Recognition On A Single Chip LCD Has Flat-Panel Benefits At CRT Cost Product Update: High-Performance OP AMPS; A Hearst Business Publication; pp. 1, 5, 33-34.
Fieldbus System Engineering Guidelines, Fieldbus Foundation, 2003-2004, pgs., (103 pages).
High Efficiency, 2-Phase Synchronous Step-Down Switching Regulators, Linear Technology, Jan. 1, 1998, LTC1628/LTC1628-PG, 32 Pages.
High Efficiency Synchronous Step-Down Switching Regulator, Linear Technology, Jan. 1, 1998, LTC1735, 33 Pages.
High-frequency digital controller IC for DC/DC converters, Patella B J et al; APEC 2002. 17th. Annual IEEE Applied Power Electronics Conference and Exposition. Dallas, TX, Mar. 10-14, 2002, Annual Applied Power Electronics Conference, New York, NY : IEEE, US, vol, vol. 2 of 2. Conf. 17, Mar. 10, 2002, pp. 374-380, XP010582947, ISBN: 0-7803-7404-5, p. 375, right-hand column; figure 3, (7 pages).
Highly Programmable Voltage Supply Controller and Supervisory Circuit, Summit Microelectronics, Inc., Jun. 7, 2001, SMS44, Preliminary, 19 Pages.
IEEE Standard Codes, Formats, Protocols, and Common Commands for User with IEEE Std 488.1-1987, IEEE Standard Digital Interface for Programmable Instrumentation, IEEE Std 488.2-1992; IEEE, Jun. 18, 1992, ISBN 1-55937-238-9, 254 pages.
IMPI Intelligent Platform Management Bus Communications Protocol Specification v1.0, Intel, Hewlett-Packard, NEC, Dell, Document Revision 1.0, Nov. 15, 1999, 39 pages.
Implementing a Nationwide Energy Management System, Sjöberg, Stig; Hedberg, Tommy; Selberg, Lars; Wikström, Rober, Jan. 1, 2000, (4 pages).
Infinite Impulse Response, Wikipedia, http://en.wikipedia.org/wiki/IIR, May 2, 2006, pp. 1-4.
In-Situ Transfer Function Analysis, 2006 Digital Power Forum Presentaiton; Mark Hagen, Texas Instruments Digital Power Group, Jul. 1, 2006, (7 pages).
Installation Guide MPS Mainframe Model 66000A, Agilent Technologies, Agilent Part No. 66000-90001, Apr. 1991-2000, 26 pages.
In-System Network Analyzer, 2006 Digital Power Forum Prensentaiton, Silicon Laboratories, Jul. 7, 2006, (6 pages).
Integrate Internet Solutions Into Your Energy Management Network, Sarkinen, Johan; Lundin, Ola; Jun. 1, 1998, 7 pages.
Integrity-One: Installation, Operation and Maintenance Manual, Power-One, Inc., 1999-2003 Version 1.2 (P025374-P025559), (186 pages).
Integrity-One Power System—Rack System, Data Sheet, Power-One, Inc., Nov. 1, 2002, (P025580-P025583), (4 pages).
An Intelligent, Fault Tolerant, High Power, Distributed Power System for Massively Parallel Processing Computers, Burns, J.; Riel, J.; DiBene, T., IEEE, May 1, 1994, 0-7803-1456-5/94, pp. 795-798, (6 pages).
Intelligent Platform Management Interface Specification v1.5, Intel, Hewlett-Packard, NEC, Dell, Document Revision 1.1, Feb. 20, 2002, 459 pages.
Intelligent Power Supply Controller, Rumrill, R.S.; Reinagel, D.J.; IEEE, Aug. 1, 1991, 0-7803-0135-8/91, PAC 1991, pp. 1537-1539.
KEKB Power Supply Interface Controller Module, Akiyama, Nakamura, Yoshida, Kubo, Yamamoto, Katoh; High Energy Accelerator Research Organization, 1-1 Ohio, Tsukuba 305, Japan; International Conference on Accelerator and Large Experimental Physics and Control Systems, Jan. 1, 1997, Beijing, China 4 pgs.
Low Voltage Study Workshop Report, Charles E. Mullett; Lou Pechi; PSMA, Power Sources Manufacturers Association, The Multinational Power Electronics Association, Jan. 1, 2001, 150 Pages.
Magnet Power Supply Control System in KEKB Accelerators, Akiyama, Katoh, Kubo, Yamamoto, Yoshida; KEK, Tsukuba, Japan; International Conference on Accelerator and Large Experimental Physics and Control Systems, Jan. 1, 1999, Triest, Italy pp. 406-408.
Magnet Power Supply as a Network Object, Cohen, S.; Stuewe, R.; IEEE, Aug. 1, 1991, 0-7803-0135-8/91, PAC 1991, pp. 929-931.
Market Trends Toward Enhanced Control of Electronic Power Systems, Miles, F.M.; Danak, R.K.; Wilson, T.G.; Suranyi, G.G.; IEEE, Jan. 1, 1993, 0-7803-0982-0/93, pp. 92-98.
Memorandum Opinion and Order, *Power One* v *Artesyn Technologies, Inc.*; Civil Action 2:05cv463, Mar. 22, 2007, (88 pages).
Microchip AN811, The RS-232/DALI Bridge Interface, Microchip Technology Inc., Jan. 1, 2002, DS00811A, pp. 1-8.
Microchip AN809, Digitally Addressable DALI Dimming Ballast, Microchip Technology Inc., Jan. 1, 2002, DS00809B, pp. 1-18.
Microchip AN703, Using the MCP320X 12-Bit Serial A/D Converter with Microchip PICmicro® Devices, Microchip Technology Inc., Jan. 1, 2002, DS00703A, pp. 1-25.
Microchip PIC16C781/782 Data Sheet, 8-bit CMOS Microcontrollers with A/D, D/A, OPAMP, Comparators and PSMC, Microchip Technology Inc., Jan. 1, 2001, pp. 1-184, (186 pages).
Microcomputer Control of DC/DC Converters for Photovoltaic Applications, Peracaula et al.; Dept. of Electronics Engineering, Industrial Electronics Group—Technical University of Catalonia, Spain; 1991; 4 pgs.

Microprocessor Core Supply Voltage Set by 1 2 C Bus Without VID Lines—Design Note 279, Mark Gurries; Linear Technology—Design Notes, Jan. 7, 2002, 2 Pages.

MicroSCADA Technology Rev. 8.4.2 Documentation CD: Application Objects, Chapter 5. Data Objects, CD-ROM; Sep. 18, 1998, ABB, XP002481365; 11 Pages.

Microturbine Power Conversion Technology Review, Staunton et al.; Oak Ridge National Laboratory Technical Report; Apr. 8, 2003; 40 pages.

Modern User Interface Revolutionizes Supervisory Systems, D'Armour et al.; IEEE Computer Applications in Power; vol. 7, No. 1; Jan. 1, 1994; pp. 34-39.

Motorola Switch Mode Power Supply with Multiple Linear Regulators and High Speed CAN Transceiver, Motorola, Inc. 2002; digital dna; Analog Marketing; Rev. 2.5, Nov. 1, 2002; 33394; Multi-Output Power Supply Semiconductor Technical Data, (44 pages).

NEBS Compliant Board Level Power System, Thomas J. DeLurio, Mikhail Guz and John Ng; Summit Microelectronics, Power One, Oct. 20, 2002, 7 Pages.

New Applications Demand Programmable Power Supplies/Sources, O'Shea, Paul; http://www.evaluationengineering.com/archive/articles/0997powr.htm, Nelson Publishing, Inc., Jan. 1, 1997, 8 pages.

New Digital Power Delivery Architecture, Bob Carroll, Primarion, Sep. 1, 2004, 5 Pages.

Non-Impact Printer Power and Motor Control System on a Chip, Masson, James; Barrow, Steven; IEEE, Apr. 1, 1995, IEEE Catalogue No. 95TH8025, 0-7803-2423-4/95, pp. 98-103.

Open Architecture Distributed Processing—The Modern Design for Electric Power Network Automation, Hissey et al., IEEE Region 9 Colloquium; Sep. 1990; pp. 150-161; XP010038436.

Operating and Service Manual MQ Series DC Power Supplies, Magna-Power Electronics, Inc., Dec. 19, 2002, 48 pages.

Operating and Service Manual SBC488A, Magna-Power Electronics, Inc., Dec. 19, 2002, 58 pgs.

Operating and Service Manual SQ Series, DC Power Supplies, Magna-Power Electronics, Inc., Dec. 16, 2002, 48 pgs.

Operating Manual for Internal RS-232 Interface for XT 60 Watt and HPD 300 Watt Series Programmable DC Power Supplies, Xantrex Technology, Inc., Jun. 1, 2002, 59 pages.

An Operation and Maintenance Process Model for Energy Management, Lundin, Ola; Ericsson Components AB, Energy Systems Division, Jan. 1, 1999, S-164 81 KISTA—Stockholm, Sweden; 7 pages.

Optimizing Power Product Usage to Speed Design Validation Testing, Application Note 1434; Agilent Technologies, Nov. 22, 2002, 16 pages.

PCS Controller, Data Sheet, Power-One, Inc. Nov. 1, 2002 (P025584-P025585), (2 pages).

PCX-150A 150 Amp Pulsed Current Source Operation Manual, Version 3.0, Directed Energy, Inc., Jan. 1, 2001, Document No. 9100-0212 R4, 31 pages.

PMP 25 Rectifier Module, Data Sheet, Power-One, Inc., Undated, (P025602-P025603), (2 pages).

Power Distribution Systems for Future Homes, Lee, Po-Wa; Lee, Yim-Shu; Lin, Bo-Tao; IEEE, Aug. 1, 1999, 0-7803-5769-88/99, pp. 1140-1146.

A Power LAN for Telecommunication Power Supply Equipment, Vun C.H., Nicholas; C.T., Lau; B.S., Lee; IEEE TENCON '93 Beijing, Jan. 1, 1993, pp. 24-27.

Power Management Solutions for Networking Applications, Darmon, Luc; Smart Networks Developer Forum 2003, Jun. 4-6, 2003, Euro-Disney Paris, France, Motorola digital dna; pp. 1-26; www.motorola.com/sndf.

Power System Controller in an Intelligent Telecom Rectifier Plant, Roth, Ueli; IEEE, Aug. 1, 1992, 0-7803-0779-8/92, pp. 476-483.

Preliminary Information 1.5A Switch-Mode Power Supply with Linear Regulator, 33701; Power Supply Integrated Circuit; Motorola Seminconductor Technical Data; Analog Marketing MC33701/D Rev. 1.0, May 1, 2003; Motorola digial dna; pp. 1-24.

Presenting DALI, AG DALI, Jul. 1, 2003, pp. 1-17.

Programmable Four-Channel Step-Down DC/DC Converter, Texas Instruments, Oct. 1, 2001, TPS54900, 16 Pages.

Programming Guide Series 661xxA MPS Power Modules, Agilent Technologies, Agilent Part No. 5959-3362, 1991-2000, 114 pages.

Programmer Manual, PS2520G & PS2521G Programmable Power Supplies, Tektronix, 070-9197-00, Jan. 1, 1995, 70 pages.

Power Management for Communications: Product Information, Summit Microelectronics, Inc., Jan. 23, 2001, 168 Pages, http://www.summitmicro.com.

Power Management for Communications: Corporate Overview, Summit Microelectronics Inc., Oct. 1, 2002, 213 Pages.

Power Semiconductors and Power Supplies—The Building Blocks of the Digital Power Revolution, Todd Cooper and Holman Harvey; Stephens, Inc. Investment Bankers, Sep. 1, 2000, 132 Pages.

Quad Tracking Power Supply Manager, Summit Microelectronics, Inc., Mar. 4, 2002, SMT4004, 35 Pages.

Quantization Resolution and Limit Cycling in Digitally Controlled PWM Converters, Peterchev, Angel V.; Sanders, A.V.; Electrical Engineering and Computer Science; UC Berkley; Power Electronics Specialists Conference, 2001.PESC, vol. 2, Jun. 17-21, 2001; pp. 465-471; XP002274573, (4 pages).

R Option, S Option DC Power Supplies, IEEE 488.2/RS-232 Programming Manual; Power Ten, Document No. M550013-01 Rev C, Jun. 25, 2002, 56 pages.

SCPI Programming Examples for GPIB-M, Xantrex Technology, Inc., Nov. 26, 2002, 1.0, 3 pages.

Service Guide for Agilent 6610xA Power Modules, Agilent Technologies, Agilent Part No. 5959-3364, Dec. 1, 2002, 101 pages.

Silicon Labs Preliminary Invalidity Contentions, Civil Action No. 2-05-CV-463 (LED)—May 26, 2006 (U.S. District Court Eastern District of Texas), (80 pages).

A Simple digital hardware to control a PFC converter, Zumel P et al; IECON'01. Proceedings of the 27th. Annual Conference of the IEEE Industrial Electronics Society. Denver, CO, Nov. 29-Dec. 2, 2001, Annual Conference of the IEEE Industrial Electronics Society, New York, NY : IEEE, US, v01. vol. 1 of 3. Conf. 27, Nov. 29, 2001, pp. 943-948, XP010572905 ISBN: 0-7803-7108-9, paragraph [IIIC].

Single-Inductor Multiple-Output Switching Converters, Wing-Hung Ki and Dongsheng Ma; Integrated Power Electronics Laboratory, Department of Electrical and Electronic Engineering, The Hong Kong University of Science and Technology, Clear Water Bay, Hong Kong SAR, China, Jan. 1, 2001, 6 Pages.

Six-Channel Power Supply Supervisor and Cacsade Sequence Controller, Summit Microelectronics, Inc., Jul. 16, 2003, SMS66, Preliminary Information, 26 Pages.

SMBus Controls CPU Voltage Regulators without VID Pins, Mark Gurries, Design Ideas, Linear Technology Magazine, Sep. 1, 2001, 2 Pages.

SMBus VID Voltage Programmers, Linear Technology, Jan. 1, 2001, LTC1699 Series, 20 Pages.

SMH4804, SMP9210 and SMT4004 Telecom Reference Design, Summit Microelectronics, Inc., Sep. 5, 2002, Application Note 25, 17 Pages.

Synchronization of Multiple Voltage Regulator Outputs, Mueller, M.W.; et al., IBM Technical Disclosure Bulletin, Jun. 1, 1999; 2 pages.

System Management Bus (SMBus) Specification Version 2. Duracell, Inc., Energizer Power Systems, Inc., Fujitsu, Ltd., Intel Corporation, Linear Technology, Inc., Maxim Integrated Products, Mitsubishi Electric Semiconductor Company, PowerSmart, Inc., Toshiba Battery Co. Ltd., Unitrode Corporation, USAR Systems, Inc., Aug. 3, 2000, pp. 1-59.

System Management Bus Specification, Revision 1.1, Smart Battery System Specifications, Revision 1.1, Dec. 11, 1998; Copyright 1996, 1997, 1998, Benchmarq Microelectronics Inc., Duracell Inc., Energizer Power Systems, Intel Corporation, Linear Technology Corporation, Maxim Integrated Products, Mitsubishi Electric Corporation, National Semiconductor Corporation, Toshiba Battery Co., Varta Batterie AG. 39 pgs.

Technical Overview, FOUNDATION™ fieldbus, Freedom to Choose. Power to Integrate, Fieldbus Foundation, Jan. 1, 2003, FD-043 Rev 3.0, pp. 1-37.

Testing Intelligent Power Supplies for the Los Alamos National Laboratory Accelerator Complex, Sturrock, J.C. ; Cohen, S.; Weintraub, B.L.; Hayden, D.J.; Archuletta, S.F. ; Los Alamos National Laboratory, Jan. 1, 1992, pp. 217-219.

Uniform Language for Accessing Power Plants—Human-Machine Language, ANSI T1.317-1993; American National Standards Institute, Dec. 14, 1993, 55 pages.

User's Guide Series 661xxA MPS Power Modules & Model 66001A MPS Keyboard, Agilent Technologies, Agilent Part No. 5959-3386, Apr. 1992-2000, 53 pages.

User Manual, PS2520, PS2520G, PS2521 & PS2521G Programmable Power Supplies, Tektronix, 070-9196-00, Jan. 1, 1995, 56 pages.

Volume 1: Syntax and Style, SCPI Consortium, May 1, 1999, Version 1999.0, 67 pages.

Volume 1: Syntax and Style, Standard Commands for Programmable Instruments (SCPI) Consortium, May 1, 1997, Version 1997.0, 68 pages.

Volume 2: Command Reference, SCPI Consortium, May 1, 1999, Version 1999.0, 565 pages.

Volume 2: Command Reference, SCPI Consortium, May 1, 1997, Version 1997.0, 506 pages.

Volume 3: Data Interchange Format, SCPI Consortium, May 1, 1999, Version 1999.0, 72 pages.

Volume 3: Data Interchange Format, SCPI Consortium, May 1, 1997, Version 1997.0, 73 pages.

Volume 4: Instrument Classes, SCPI Consortium, May 1, 1999, Version 1999.0, 115 pages.

Volume 4: Instrument Classes, SCPI Consortium, May 1, 1997, Version 1997.0, 58 pages.

VXI Bus Programmable DC Power Supplies, Advanced Power Designs, Inc., Irvine, CA; Jan. 1, 1993, (4 pages).

Why have Monitoring?, Shawyer, P.; Hobbs. P.; McLeod, A.; Jan. 1, 2001, 8 Pages.

Wide Operating Range, No Sense Step-Down Controller, Linear Technology, Jan. 1, 2001, LTC1778/LTC1778-1, 24 Pages.

Wide Operating Range, No Sense Step-Down DC-DC Controller with SMBus Programming, Linear Technology, Jan. 1, 2001, LTC1909-8, Pages, (33 pages).

\* cited by examiner

ISOLATED CURRENT TO VOLTAGE, VOLTAGE TO VOLTAGE CONVERTER

RELATED APPLICATION DATA

This application claims the benefit, pursuant to 35 U.S.C. §119(e), of U.S. provisional application Ser. No. 60/983,884, filed Oct. 30, 2007.

BACKGROUND OF THE INVENTION

1. Field of the Invention

The present invention relates to devices for measuring electrical current by converting current into a voltage. More particularly, the invention relates to high-bandwidth devices for measuring both direct and alternating currents that are isolated from the circuit being measured.

2. Description of Related and Prior Art

Several techniques for measuring current are known. The simplest one comprises a shunt resistor inserted into the current path. While this method is inexpensive, it provides no isolation, and it consumes excessive power, especially when a large signal amplitude is required.

Another technique employs a Hall-effect current sensor. This kind of sensor provides isolation, good resolution and low losses. Unfortunately, the bandwidth of such a device is limited to a few hundred kilohertz, and the cost is high compared with that of a shunt resistor. Moreover, this sensor exhibits a sizeable temperature drift, even when additional compensating circuitry is employed. Furthermore, to achieve an accuracy that is satisfactory for most purposes, the sensor must be implemented using a relatively large magnetic core with a gap in order to adequately concentrate the magnetic field around the current-carrying conductor. This adds to the bulk, weight, and cost of this type of current sensor.

Recently, current sensors based on the Anisotropic Magneto Resistance (AMR) effect have been introduced. The AMR effect results from the resistance change of ferromagnetic materials in the presence of an applied magnetic field. Using this effect, it is possible to build a sensor with a higher bandwidth than a Hall-effect sensor, but the output voltage of such a sensor is also subject to temperature variations. Furthermore, to generate a sufficient output voltage, an amplifier circuit is required that adds cost to the device. Overall, this sensor is more expensive than either a Hall-effect current sensor or a simple shunt resistor.

The Giant Magnetic Resistance (GMR) effect may also be used for current measurement. This effect results from the magnetic sensitivity of the resistance of a multi-layer structure. Although the GMR effect exhibits a higher sensitivity than the AMR effect, the GMR effect also exhibits a strong non-linear behavior. As of yet, no commercial current sensors based on this technique are available.

Fluxgate-based sensors have better accuracy and temperature behavior than sensors based on any of the above principles but achieve this at remarkably higher cost, and larger physical size. This makes such sensors undesirable for many applications.

Another class of sensors is based on the principle of routing a current to be measured through the primary side of a transformer and using it to hold the transformer core in saturation. A voltage is then applied at the secondary side to force the core into the linear range, creating a current through the secondary side that is proportional to the primary current. This secondary current is then measured using a sense resistor. However, such sensors are unable to measure small currents that are insufficient to saturate the magnetic core.

Currents near zero can be measured with the addition of a bias winding carrying a steady current sized to keep the core in saturation. However, the bias current produces a steady power drain, and furthermore produces a voltage offset at the sense resistor. Therefore, to achieve high accuracy, the current through the bias winding must be controlled to high precision. Furthermore, the bandwidth of this type of current sensor is necessarily quite small because it employs a magnetic core of a ferrite or permalloy material with a large cross-sectional area. In addition, because ferrite and permalloy cores are highly susceptible to temperature changes, this type of sensor exhibits a significant temperature dependence.

Accordingly, there is a need for an improved current sensor that measures alternating and direct currents over a large measurement range while exhibiting high-bandwidth and high-accuracy and achieving low power consumption, good isolation from the current being measured, low temperature sensitivity, and low cost.

SUMMARY OF THE INVENTION

A high-accuracy, high-bandwidth current sensor is achieved using a transformer comprising a magnetic core, having a primary winding with one or more turns that carries the current to be measured, a secondary winding that is used to sample the primary current, and an auxiliary winding used to selectively bring the core into saturation regardless of the magnitude of the primary current. Alternatively, the auxiliary winding may be eliminated and both the sampling and the saturation function performed using the secondary winding at the cost of a slightly more complex control circuit. This current sensor consumes little power, provides galvanic isolation between the measured current and the sensor, exhibits low temperature sensitivity, and is inexpensive due to the nature of the magnetic core material and the method of controlling the windings.

In several embodiments, discussed below, of a current sensor in accordance with the present invention, a direct current or alternating current is converted into a voltage with a defined and reproducible transfer characteristic. The resulting output voltage of the sensor has an amplitude of several volts that makes it possible to interface directly with an analog-to-digital converter (ADC). The sensor provides isolation between the current to be measured and the sense circuit and induces an average voltage drop on the primary side of zero. The sensor is able to measure positive and negative currents with a bandwidth beyond 1 MHz at minimum power loss. It is also able to accurately measure currents down to zero amps by using a pulsed auxiliary current to selectively saturate the magnetic core material rather than a constant current as employed by prior-art sensors. This method greatly reduces power consumption and the output voltage offset, thereby improving the dynamic range of input current the sensor is able to measure. Because the auxiliary current is pulsed, the auxiliary winding can be adapted to recover a substantial amount of the energy used to control the transformer flux, resulting in a reduction of power losses of up to 50% as compared with prior art sensors. Further, because the invention eliminates the dependency of the offset voltage on the supply voltage, the measurement accuracy is increased over prior-art sensors that use a constant auxiliary current. In addition, because the auxiliary current does not affect the accuracy of the measurement, it can be generated by a very simple and low-cost circuit. A further benefit of the pulsed auxiliary current is that an overcurrent event will not alter the offset voltage, as it does in several prior-art sensors.

The pulsed nature of the auxiliary current enables additional embodiments of the present invention in which the auxiliary winding can be eliminated and the saturation function taken over by the secondary winding. Because the invention does not require a constant current to flow through an auxiliary winding, the secondary winding can be time shared, serving first to saturate the magnetic core and then to sample the primary current. This reduces the size and complexity of the magnetic circuit at a cost of slightly increased circuit complexity. However, if the control circuit and switches are implemented in an application-specific integrated circuit (ASIC), the increased circuit complexity increases neither the cost nor the bulk of the sensor.

The output voltage of a sensor in accordance with the present invention may be processed digitally to further improve the precision by using curve fitting and temperature compensation techniques well known to those skilled in the art. However, alternative embodiments that do not employ digital correction techniques are also within the scope and spirit of the present invention. Several specific embodiments of a current sensor are discussed below and should be taken as illustrative examples of the advantages afforded by the present invention to one skilled in the art and are not intended to restrict the invention to any particular embodiment.

A first embodiment of a current sensor in accordance with the present invention comprises a transformer with a magnetic core around which are wound a primary winding comprising of one or more turns, a secondary winding used to measure the primary current, and an auxiliary winding used to force the magnetic core into saturation. A programmable saturating switch is used to selectively apply a voltage across the auxiliary winding in order to bring the magnetic core into saturation, even in cases in which the current flowing through the primary winding is insufficient to do so by itself. In order to reduce power consumption, the saturating switch is closed just long enough to ensure that the magnetic core is saturated. The saturating switch is then opened, and a sampling switch is closed. The sampling switch applies a voltage across the secondary winding, and forces the magnetic core back into the linear region. Once there, the current flowing through the secondary winding becomes proportional to the current in the primary winding. This current is converted to a voltage across a sense resistor, and the sense voltage is then sampled by an analog-to-digital converter. The sampling switch is then opened, and the current through the secondary winding freewheels through a set of diodes, eventually returning the circuit back to its original state. The measurement process may be repeated at a frequency limited only by the time required to bring the core out of saturation and into a state in which the measurement signal is stable, and then to reset the circuit after opening the sampling switch. A judicious choice of magnetic core material and geometry enables sampling rates in excess of 1 MHz. Alternatively, because the sensor consumes power only during the measurement process, the power consumption may be further reduced by decreasing the sampling rate.

To minimize offset current and the time required to force the transformer out of saturation, a magnetic material with a low coercive force and highly square B-H loop is selected in an embodiment of a current sensor in accordance with the present invention. The sampling frequency can be increased by reducing the cross sectional area of the core material without affecting the measurement accuracy. Amorphous and nanocrystalline alloys are examples of magnetic materials that exhibit the desired characteristic. While permalloys and supermalloys are generally more costly and exhibit poorer temperature stability, they can be plated onto a substrate that allows for a highly compact geometry. Accordingly, these materials are also within the scope and spirit of the present invention.

A second embodiment of a sensor in accordance with the present invention can be used to measure bidirectional as well as unidirectional currents at a cost of slightly increased power consumption and a dependence of the measurement accuracy on the auxiliary current used to saturate the magnetic core. This is achieved by using the circuit of the first embodiment but changing the switch control scheme. Rather than opening the saturating switch, it is left closed while the sampling switch is closed. The field created by the auxiliary current thus effectively adds to that created by the primary current and results in the appearance of an offset voltage at the sense resistor. Thus, the accuracy of the primary current measurement becomes dependent on the precision of the auxiliary current, but provides the benefit of being able to measure bidirectional currents. Because the auxiliary current is switched off after the voltage of the sense resistor is measured, the overall power consumption of the sensor remains low with respect to prior-art sensors.

A third embodiment of a current sensor in accordance with the present invention includes a modification to the primary-side input circuit to allow the measurement of a voltage source rather than a current source. To do so, a resistor is placed in series with the voltage source in order to generate a current that is routed through the primary winding. Since a large resistor and correspondingly small currents are desirable in order to conserve power, the number of turns of the primary winding may be increased to compensate for the smaller current. This embodiment of a current sensor is particularly useful in applications requiring the measurement of a voltage superimposed upon a high, floating voltage potential and enables the construction of high-bandwidth and high-accuracy voltage probes. This embodiment is also a particularly good low-cost solution when an isolated measurement of a voltage is required, e.g., to overcome the isolation boundary between the primary side and secondary side of an isolated switched mode power supply. It should be noted that no auxiliary power supply is required on the primary side.

A fourth embodiment of a current sensor in accordance with the present invention generates a low-cost analog output by eliminating the analog-to-digital converter and replacing it with a simple sample-and-hold circuit. The sample-and-hold circuit is clocked by the control circuit managing the switches in order to ensure that the sense voltage is captured at the correct moment.

In a fifth embodiment in accordance with the present invention, the output circuit is configured to act as an overcurrent alarm or protection circuit. The voltage across the sense resistor is compared to a reference voltage level using an analog comparator. The output of the comparator is latched using a D-Q flip flop or other latching circuit clocked by the control circuit controlling the switch timings. The output of the D-Q flip flop thus is useful as a stable logic-level overcurrent alarm or protection signal.

In a sixth embodiment of a current sensor in accordance with the present invention, the dynamic range of the current sensor is improved by including one or more range-select switches. The range-select switches allow the control circuit to selectively switch additional resistors into or out of the circuit in parallel or in series with the sense resistor. This enables both low-current and high-current sources to be measured with a single analog-to-digital converter at high relative accuracy by selecting a high range or a low range by changing the position of one or more range-select switches.

A seventh embodiment of a current sensor in accordance with the present invention eliminates the auxiliary winding and uses the secondary winding to saturate the magnetic core before the sampling switch is closed. Because the auxiliary current is required only during time intervals when the sampling switch is closed, the single secondary winding can be time shared between the saturating and sampling functions. Because only two windings are required, this embodiment achieves a higher level of integration and potentially lower cost. This embodiment is particularly well suited for control by an application-specific integrated circuit as is discussed in more detail below. Note, however, that because this embodiment necessarily requires the saturating switch to be opened while the sampling switch is closed, it cannot be used to measure bidirectional currents as described in the second embodiment.

In an eighth embodiment in accordance with the present invention, two copies of a sensor circuit are configured to measure a single primary current in order to provide a continuous measurement of the primary current, thus greatly increasing the measurement bandwidth. The primary current is routed through the primary windings of two transformer cores, and a single control circuit manages two measurement circuits operating in accordance with the present invention. The control circuit periodically switches the output between the two measurement circuits, and as long as the sampling duty cycles of each circuit are maintained greater than 50% and are shifted approximately 180 degrees out of phase, a continuous measurement of the primary current is maintained.

In a ninth embodiment in accordance with the present invention, the sensor is adapted to reduce the power loss by recovering some of the energy used to control the transformer via the auxiliary winding back into the power source. This can reduce the power loss up to 50%. Further, the components count is reduced, which decreases the system cost. This embodiment points out an additional important advantage over prior art sensors that use a constant auxiliary current. Due to the constant auxiliary current in prior art sensors, the auxiliary winding cannot be adapted to recover the energy, and the current that flows after opening the sampling switch is dissipated resulting in substantially higher power loss.

In any of the above-described embodiments, a control circuit may control the timing and duty cycles of a saturating switch and a sampling switch and may also control the timing of an analog-to-digital converter used to sample a voltage developed by a sensing circuit. The control circuit may also control a sample-and-hold circuit or a D-Q flip flop used to sample a sense voltage. The control circuit may comprise a digital signal processor (DSP), a microcontroller, a field programmable gate array (FPGA), an application-specific integrated circuit (ASIC), a circuit built from discrete logic, or any other digital control circuit known to those skilled in the art. The use of an analog circuit to control switch timings is also within the scope and spirit of the present invention.

The foregoing descriptions of several embodiments of a current sensor are intended to serve as illustrative examples of the advantages afforded by the present invention to one skilled in the art and are not intended to restrict the invention to any particular set of embodiments. A more complete understanding of a current sensor providing high-accuracy and high-bandwidth current measurements, as well as low temperature sensitivity and low cost, will be afforded to those skilled in the art, as well as a realization of additional advantages and objects thereof, by consideration of the following detailed description of the preferred embodiment. Reference will be made to the appended sheets of drawings which will first be described briefly.

DETAILED DESCRIPTION OF THE PREFERRED EMBODIMENT

The present invention provides a current sensor adapted to measure a current flowing through a primary winding using a magnetic-core transformer that is selectively brought to saturation, regardless of the magnitude of the primary current. The sensor provides high-accuracy and high-bandwidth current measurements as well as low temperature sensitivity and low cost. In the detailed description that follows, like element numerals are used to indicate like elements appearing in one or more of the figures.

Figure 1:
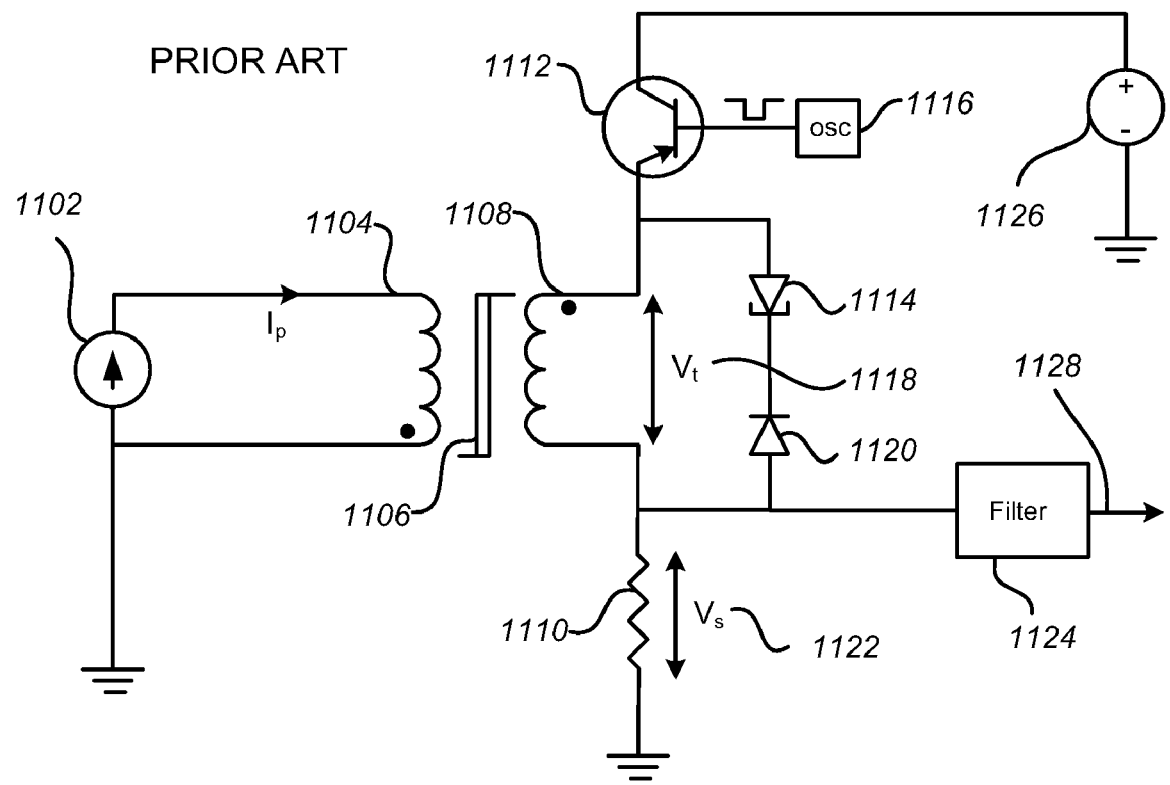
FIG. 1 is a schematic diagram of a conventional current sensor employing a saturable transformer.

FIG. 1 depicts a schematic of a conventional current sensor able to measure direct currents that employs a transformer to isolate the current being measured from the measurement circuit. The current being measured 1102 flows through the primary winding 1104 of a transformer comprising a magnetic core 1106 that is held in saturation by the current flowing in the primary winding 1104. An oscillator 1116 is used to generate a periodic pulse that turns on a switch 1112, applying a voltage from the power supply 1126 to the secondary winding 1108 of the transformer. The secondary current forces the magnetic core back into the linear region and develops a voltage drop 1118, labeled $V_p$, across the secondary winding 1108. Diodes 1120 and 1114 allow the current to free wheel through the secondary winding 1108 when the switch 1112 is opened. The voltage drop 1122, labeled $V_s$, across a sense resistor 1110, is routed to an analog filter 1124 that outputs a voltage 1128 that is proportional to the current being measured 1102. The disadvantage of this circuit is that the core must be held in saturation by the current being measured 1102, preventing this circuit from being used to measure low currents that produce magnetic fields in the transformer insufficient to bring the core into saturation. Furthermore, this circuit is unable to measure bidirectional currents.

Figure 2:
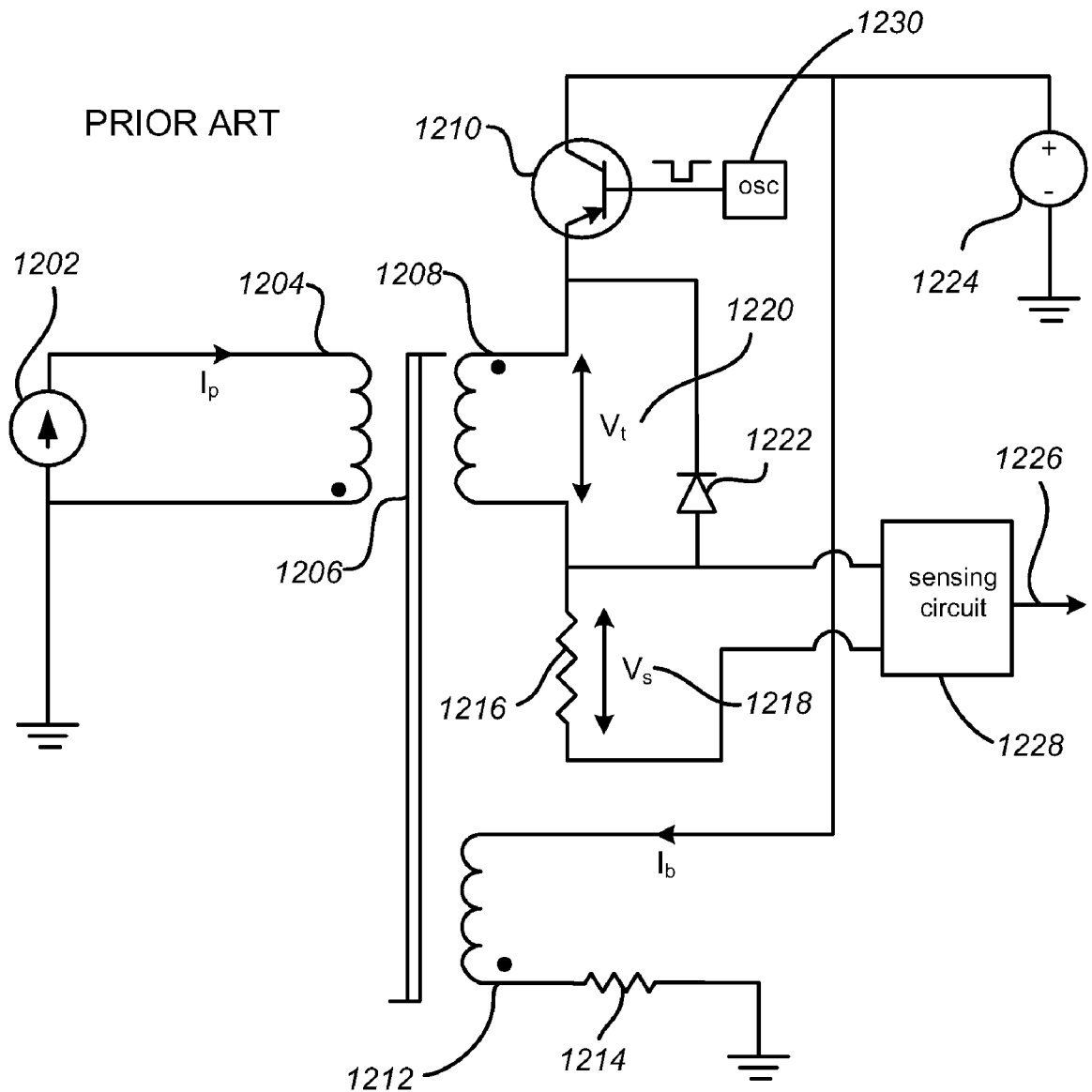
FIG. 2 is a schematic diagram of a conventional current sensor employing a saturable transformer, modified to allow measurement of currents near zero.

FIG. 2 depicts a schematic of an alternative conventional current sensor that solves the problem of measuring currents near zero but introduces the additional disadvantages of increased power consumption, and a measurement accuracy that depends on precision control of a biasing current. In this circuit, the current being measured 1202 flows through a primary winding 1204 of a transformer with a magnetic core 1206. The transformer includes both a secondary winding 1208 and a bias winding 1212. The bias current, $I_b$, through the bias winding 1212 is set by a resistor 1214 in series with a power supply 1224. Current $I_b$ serves to hold the transformer in saturation even in the case of primary currents near zero. As in the circuit depicted in FIG. 1, an oscillator 1230 periodically closes a switch 1210 to apply a voltage to the secondary winding 1208 in order to force the core 1206 back into the linear region. This produces a voltage drop 1218, labeled $V_s$, across a sense resistor 1216 that is proportional to the sum of the bias current through the bias winding 1212 and the primary current through primary winding 1204 scaled by the turns ratio of the windings 1204, 1208, and 1212. The voltage drop across the sense resistor 1216 is measured using an analog processing circuit 1228 that also compensates for the offset voltage produced by the bias current to produce an analog output voltage 1226 that is proportional to the primary current being measured. However, one skilled in the art will recognize that the bias current produces a steady power drain and also adds an offset to the primary current measurement such that the accuracy of this measurement is limited by the stability of the bias current.

Figure 3:
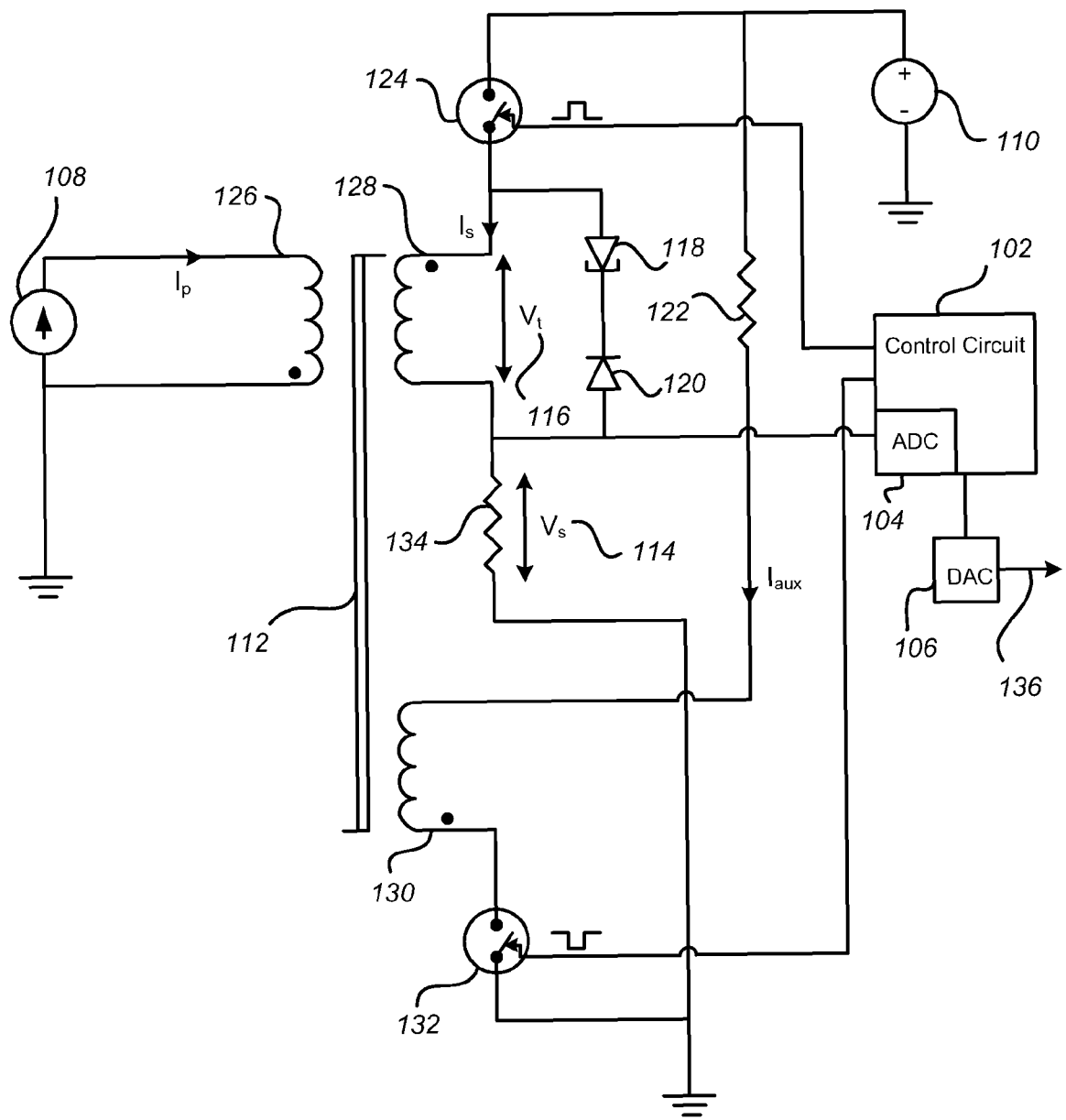
FIG. 3 is a schematic diagram of a first exemplary embodiment of a current sensor in accordance with the present invention.

FIG. 3 depicts a first exemplary embodiment of a current sensor in accordance with the present invention. In this embodiment, the current sensor comprises a transformer composed of an annular magnetic core 112 including a primary winding 126, a secondary winding 128, and an auxiliary winding 130, adapted to selectively bring the core 112 into saturation. The primary winding 126 comprises at least a single turn and carries the current to be measured 108. The ratio of the number of turns in the primary winding 126 to those in the secondary winding 128 to those in the auxiliary winding 130 is represented by $N_p:N_s:N_{aux}$. A sense resistor 134 is disposed in series with the secondary winding 128 to develop a voltage drop 114, labeled $V_s$, that is proportional to the primary current, scaled by the ratio of $N_p/N_s$ multiplied by the value of the sense resistor 134. The transformer core 112, primary winding 126, and secondary winding 128 thus provide isolation between the current being measured 108 and the voltage 114 representing a measurement of that current.

In this embodiment, a saturating switch 132 is pulsed closed under the control of a control circuit 102 which could be implemented as a field-programmable gate array (FPGA), an application-specific integrated circuit (ASIC), a digital signal processor (DSP), a microcontroller, or built from discrete digital components. However, it should be appreciated that the saturating switch 132 could also be closed under the control of an analog circuit and still fall within the scope and spirit of the present invention. When the saturating switch 132 is closed, current $I_{aux}$ flows from power source 110 through the auxiliary winding 130. The magnitude of current $I_{aux}$ is limited to $V_{dc}/R_1$, where $V_{dc}$ is the voltage of power source 110, and $R_1$ is the resistance of the current-limiting resistor 122. The magnitude of this current is chosen to assure that the magnetic core 112 is brought into saturation prior to measurement of the primary current 108. However, it should be noted that when the saturating switch 132 is open, no current flows through the auxiliary winding 130 and therefore, no power is dissipated here during the off cycle.

A sampling switch 124 is pulsed closed under the control of the control circuit 102. When the sampling switch 124 is closed, a voltage is applied at the secondary transformer winding 128 that forces the transformer core 112 out of saturation. Two diodes, 120 and 118, allow the current to freewheel through the secondary winding 128 once the sampling switch 124 has been opened.

Figure 4:
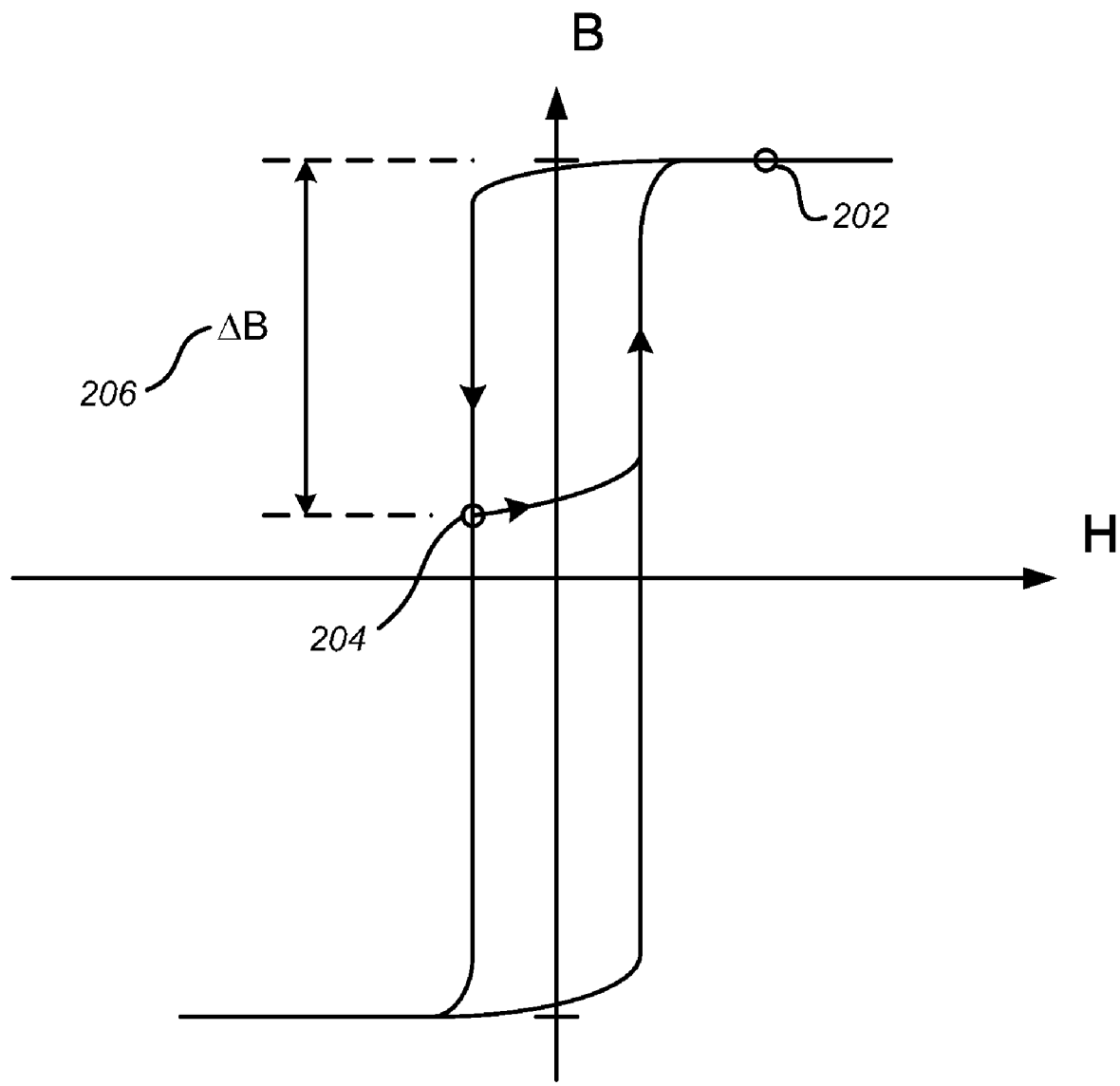
FIG. 4 is a representative hysteresis plot depicting the relationship between the magnetic field strength (H) and magnetic flux density (B) in the magnetic material employed in an exemplary embodiment of a current sensor in accordance with the present invention.

FIG. 4 illustrates the operating and set points for one embodiment of the current sensor in accordance with the present invention. The B-H hysteresis curve of the magnetic core 112 is illustrated wherein the magnetic field strength (H) is plotted along a horizontal axis, the magnetic flux density (B) is plotted along a vertical axis. When the sampling switch 124 is opened and the saturating switch 132 is closed, the magnetization of the core 112 moves to the operating point 202 at which the core 112 is saturated. The precise location of the operating point 202 depends on the value of the primary current. However, judicious selection of the auxiliary current will assure that the operating point 202 never moves out of the saturated region of the B-H curve. Once the core is at the operating point, the saturating switch 132 is opened, and the sampling switch 124 is closed, causing the magnetization to walk around the B-H curve to the set point 204, at which point the sense voltage 114, representing the primary current 108, is measured. The measurement process is further described below with reference to the timing diagram of FIGS. 5a-c.

Figures 5A, 5B, 5C:
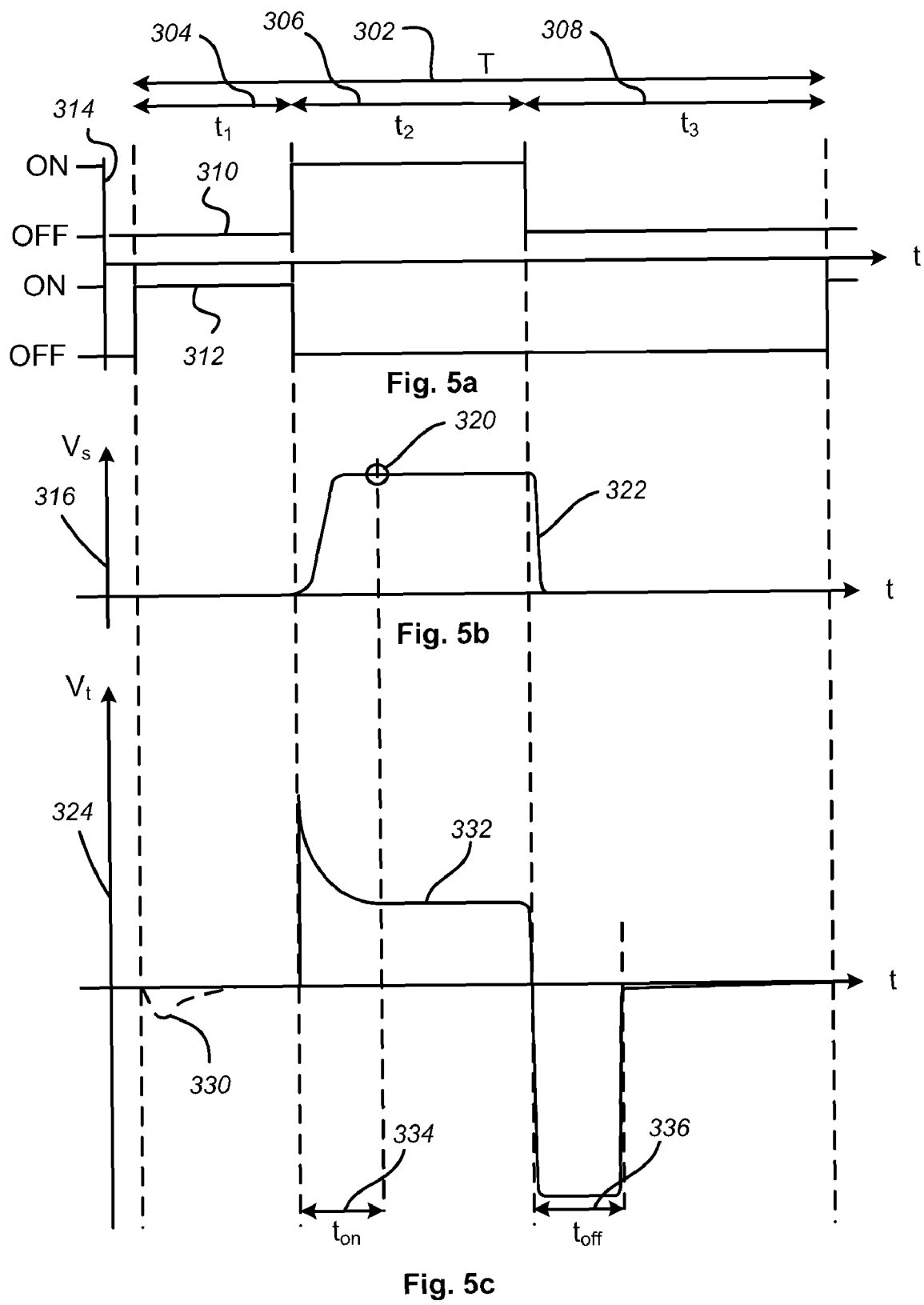
FIGS. 5a-c depict representative voltage waveforms measured at different locations of a representative embodiment of a current sensor in accordance with the present invention.

FIGS. 5a-c illustrate a representative timing diagram in accordance with an embodiment of the present invention. The time bases of FIGS. 5a, 5b, and 5c are identical and correspond to one another. The sense voltage 114, proportional to the primary current 108 (see FIG. 3), is sampled once per sampling time period 302, labeled as T. The sampling period T is further subdivided into three time periods: a first time period 304, represented by $t_1$; a second time period 306, represented by $t_2$; and a third time period 308, represented by $t_3$. The vertical axis 314 of FIG. 5a represents the state of the saturating switch 132, represented by the lower trace 312, and the sampling switch 124, represented by the upper trace 310. During time period $t_1$, the saturating switch 132 is on and the sampling switch 124 is off. During time period $t_2$, the saturating switch 132 is off, and the sampling switch 124 is on. During time period $t_3$, both the saturating switch 132 and the sampling switch 124 are off.

The vertical axis 316 of FIG. 5b represents the magnitude of the sense voltage 114, labeled $V_s$, across the sense resistor 134 (see FIG. 3). The vertical axis 324 of FIG. 5c represents the magnitude of the secondary winding voltage 116, labeled $V_t$ (see FIG. 3). During time period $t_1$, the saturating switch 132 is closed, and a constant current of $I_{aux}=V_{dc}/R_1$ flows through the auxiliary winding 130 and forces the transformer core 112 into saturation at the operating point 202, shown in FIG. 4. If the primary current 108 was insufficient by itself to hold the core 112 in saturation before the closure of the saturating switch 132, the current $I_{aux}$ will not immediately rise to $V_{dc}/R_1$, and a transitory negative voltage will appear across the secondary winding 128. A representative negative voltage transient is depicted in FIG. 5c, illustrated by the dashed trace 330. Time period $t_1$ must last long enough for $I_{aux}$ to rise to its steady-state level, at which time the magnetic core 112 is in saturation and has reached operating point 202.

The saturating switch 132 is then opened and the sampling switch 124 is closed at the beginning of time period $t_2$. At this point, the auxiliary current $I_{aux}$ stops flowing, and the current, $I_s$, through the secondary winding 128 takes over. The voltage, $V_t$, across the secondary winding is given by:

$$V_t = V_{dc} - I_s * R_s,$$

where $V_{dc}$ is the voltage of the power source 110, and $R_s$ is the value of the sense resistor 134, depicted in FIG. 3. Once the magnetization has walked around the B-H curve to set point 204, as shown in FIG. 4, and the magnetic core is no longer in saturation, the secondary winding current, $I_s$, is given by the following expression:

$$I_s = (I_{mag} + I_p * N_p)/N_s.$$

Here, $I_{mag}$ is the magnetizing current induced by the magnetic core 112, $I_p$ is the primary current 108, $N_p$ is the number of turns of the primary winding 126, and $N_s$ is the number of turns of the secondary winding 128. It should be noted that the secondary current depends neither on the auxiliary current nor on the on-state resistance of the sampling switch 124. The magnetizing current, $I_{mag}$, can be written as:

$$I_{mag} = I_m * H_c,$$

where $I_m$ is the magnetic path length determined by the shape of the transformer core and $H_c$ is the coercive force, a property of the magnetic material comprising the core. By selecting a core that exhibits low coercive force, a condition is achieved in which:

$$I_p * N_p >> I_m * H_c,$$

thus allowing the influence of the magnetizing current to be neglected. This is desirable because the value of the coercive force $H_c$ is subject to device-to-device variation and exhibits a distinct temperature dependence. In this case, the secondary current $I_s$ is simply equal to the primary current $I_p$ multiplied by the turns ratio $N_p/N_s$. Magnetic cores based on amorphous or nanocrystalline alloys are particularly suitable because they have a low coercive force $H_c$ and exhibit a low temperature drift. Permalloys and supermalloys do not offer high temperature stability but provide fairly low coercive force together with a high machinability that makes them suitable for use with the present invention. Ferrite materials provide neither low coercive force nor low temperature drift, but they do exhibit low cost and high machinability that makes them attractive for low-cost, low-precision current sensing applications. Thus cores made of ferrite materials also fall within the scope and spirit of the present invention. In high-precision applications in which the magnetizing current cannot be neglected, temperature and offset compensation can be implemented by any number of schemes well known to those skilled in the art.

The cross sectional area of the magnetic core 112 has no bearing on the measurement accuracy. In fact, a smaller cross sectional area, $A_c$, is preferred because the time to force the core into saturation is decreased because fewer volt-seconds must be applied across the secondary winding. Referring to FIG. 4, the time $t_{on}$, required to achieve the magnetic flux change illustrated at 206 and labeled $\Delta B$, is given, for a core with a perfectly rectangular B-H loop, by the following expression:

$$t_{on} = \frac{\Delta B * N_s * A_c}{V_{dc} - I_s * R_s}$$

Thus, reducing the cross sectional area of the magnetic core 112 not only decreases the size and cost of the current sensor but also increases its sampling rate. Alternatively, if the sampling rate is kept constant, the smaller cross sectional area reduces power consumption. Moreover, core losses are decreased because the total core volume is reduced.

After the $t_{on}$ time period 334 has elapsed, the sense voltage 114 is sampled at the sampling instant 320. In one embodiment of the current sensor in accordance with the present invention, the sense voltage 114 is sampled using an analog-to-digital converter 104 with a sample-and-hold front-end circuit. This digital signal may then be processed by the control circuit 102 or alternatively may be converted back to an analog output 136 using an optional digital-to-analog converter 106 (see FIG. 3).

At the end of time period $t_2$, the sampling switch 124 is opened, and the current through the secondary winding 128 freewheels through the diodes 118 and 120. The voltage $V_t$ across the secondary winding goes negative, as illustrated by trace 332 of FIG. 5, and remains there for time period $t_{off}$ 336 until it resets to its original value for the remainder of the time period T. Note that no negative voltage appears across the sense resistor 134. Thus, an analog-to-digital converter 104 can be connected directly, without any protection circuitry. The sampling switch 124 must be able to block the sum of the power source 110 voltage $V_{dc}$ and the voltage drop across diodes 118 and 120. During the remainder of time period $t_3$, no auxiliary current flows, so the power dissipation in a circuit in accordance with the present invention is greatly reduced with respect to the prior art.

The length of time interval $t_1$ is set such that even at zero primary current, the circuit is able to bring the magnetic core 112 into saturation. The minimum interval for $t_2$, on the other hand, is set by the time $t_{on}$ required to reach the set point 204 as illustrated in FIG. 4. The material of the magnetic core 112 and its geometry influence this value. It is desirable to keep $t_2$ as short as possible in order to reduce power consumption. For illustrative purposes, FIG. 5 shows time $t_2$ longer than it need be in practice. Once the sense voltage has reached a stable value, the analog-to-digital converter can capture its value, and the sampling switch 124 can then be opened immediately. The time interval $t_{off}$ 336 is determined by the number of volt-seconds required to bring the transformer magnetization back to the value it is driven to by $I_p$, and this sets the minimum length of time interval $t_3$. However, in many applications $t_3$ will be chosen longer than its minimum value with the intention of reducing power consumption at the cost of a lower sampling rate. After time period $t_{off}$, no power is dissipated for the remainder of time period $t_3$, and the insertion impedance on the primary side is zero. It is interesting to note that the average voltage drop on the primary side is zero because of the transformer magnetizing inductance. This voltage drop is given by the voltage $V_t$ across the secondary winding multiplied by the transformer turns ratio $N_p/N_s$.

The embodiment of the present invention illustrated in FIG. 3 is also capable of measuring bidirectional primary currents by making a change in the way the saturating and sampling switches are operated. For bidirectional applications, the saturating switch 132 can remain closed during time interval $t_2$ 306. In this case, the auxiliary current $I_{aux}$ together with the magnetization current $I_{mag}$ determine the offset of the output voltage $V_s$. In this mode, the accuracy of the auxiliary current will affect the accuracy of the output voltage, and it is important to provide it with sufficient precision. In this mode, the gain, m, of the sense voltage $V_s$ with respect to the primary input current is given by the following expression, where resistor $R_1$ 122 is used to set the auxiliary current:

$$m = \frac{N_p}{N_s} * \left( \left[ \left( \frac{N_s}{N_{aux}} \right)^2 * R_1 \right] \| R_s \right)$$

It is also possible to use a current source with high output impedance instead of resistor $R_1$ to set the auxiliary current. In this case, the gain would again be dependent only on the turns ratio and the sense resistor $R_s$ 134 because $R_1$ becomes very large.

Figure 6:
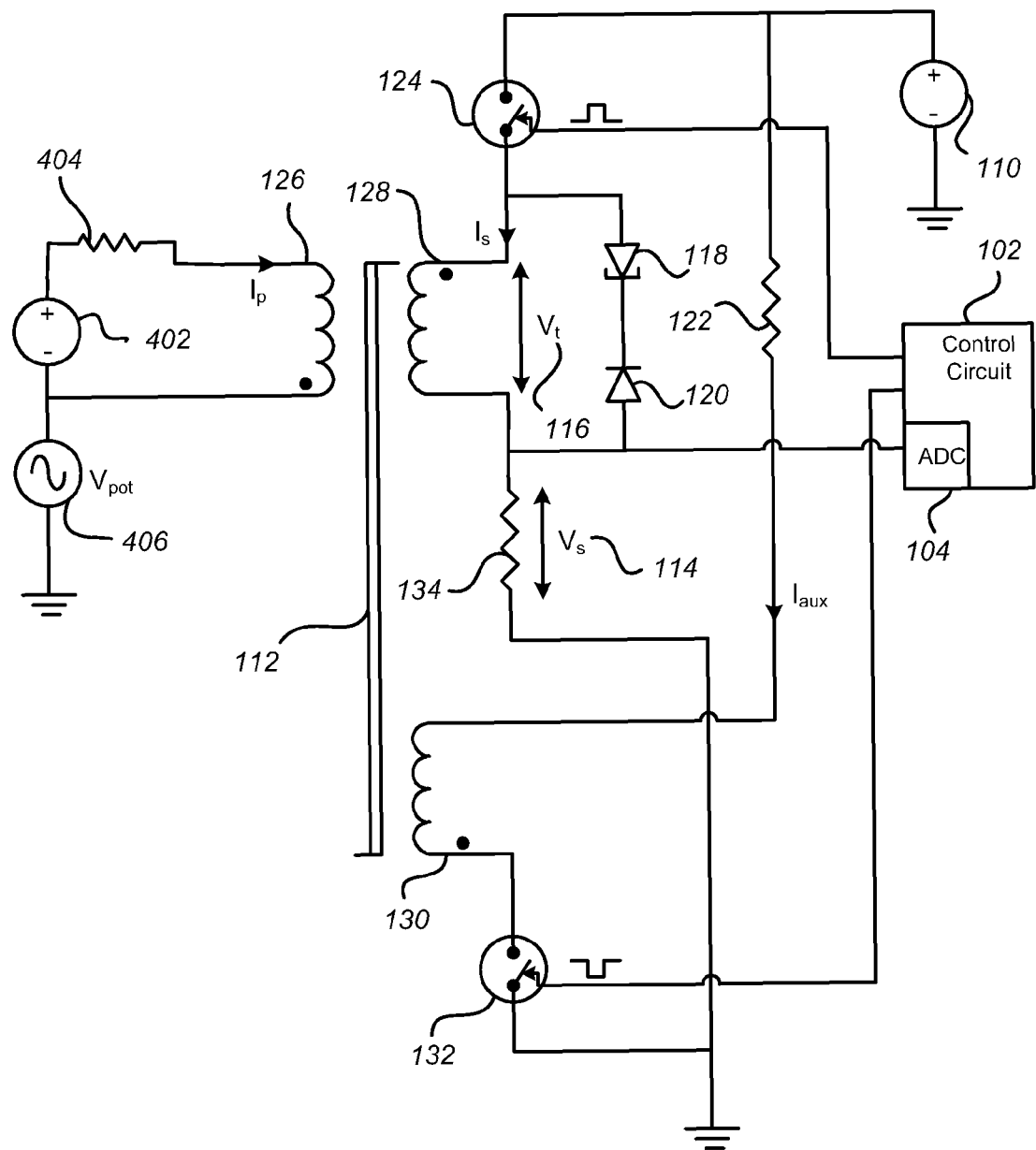
FIG. 6 is a schematic diagram of a third embodiment of the present invention adapted to measure a voltage superimposed upon an arbitrary voltage potential.

FIG. 6 represents a third embodiment of a current sensor in accordance with the present invention. In this case, it is desired to measure a voltage or voltage difference rather than a current in accordance with the present invention. To do so, a resistor 404 is employed to convert the input voltage 402 into a current that flows through the primary winding 126. The voltage source, $V_{pot}$ 406, is an arbitrary voltage, emphasizing that the sensor is able to measure a voltage difference or voltage 402 superimposed upon a high and changing voltage potential 406 by providing galvanic isolation. To keep power consumption low, the resistor 404 will generally be chosen to be quite large, thereby reducing the current flowing through the primary winding 126. To maintain the sensitivity of the sensing circuit, the number of turns in the primary winding 126 may be increased. The remainder of the circuit is identical to that shown in FIG. 3 with the exception of the optional digital-to-analog converter 106, which is not shown in FIG. 6.

Figure 7:
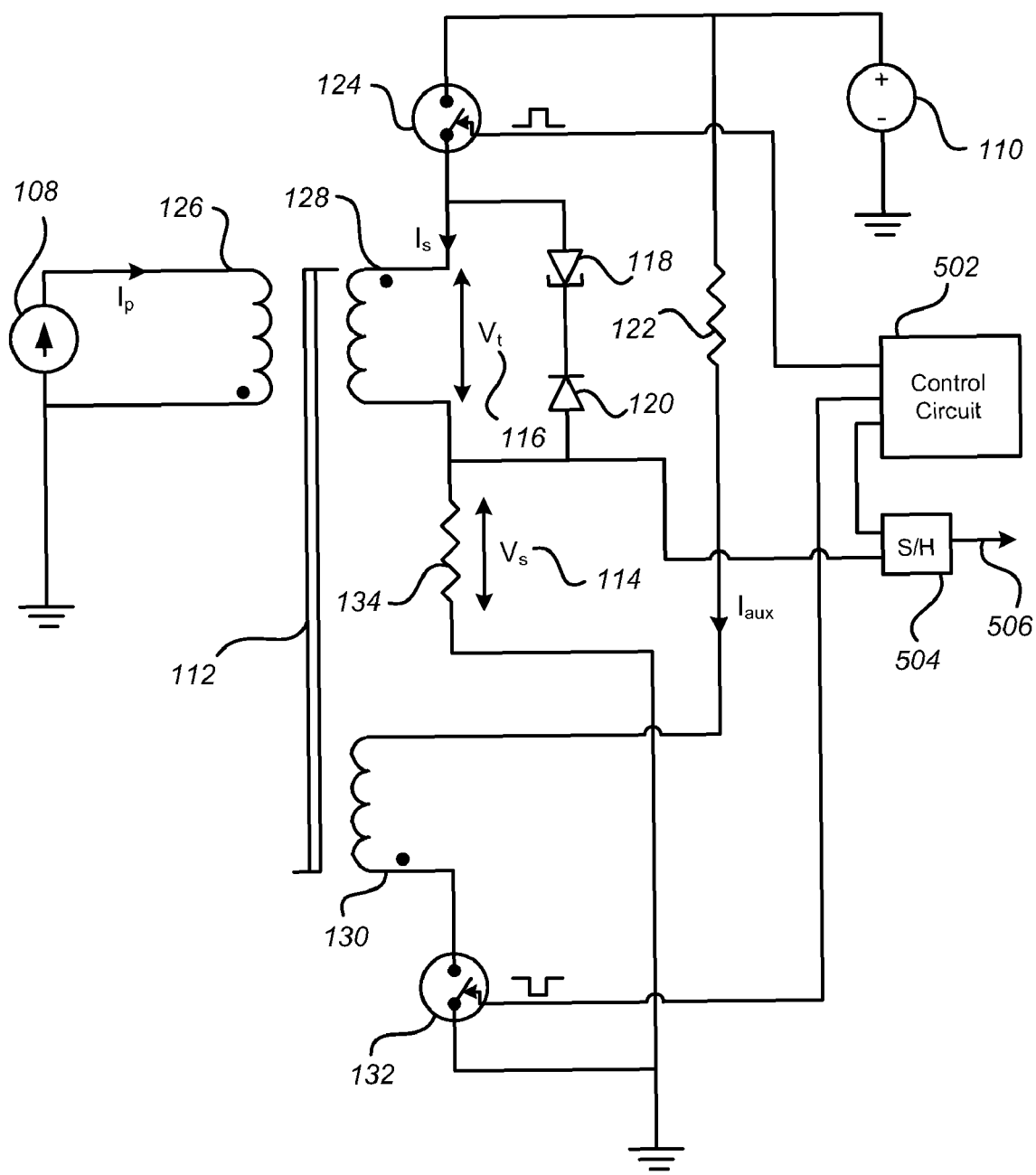
FIG. 7 is a schematic diagram of a fourth embodiment of the present invention adapted to produce an analog output signal.

FIG. 7 illustrates a fourth embodiment of the current sensor in accordance with the present invention. In order to provide a low-cost analog output, a simple sample-and-hold circuit 504 is used to acquire the pulsed voltage appearing across resistor 134. The sample-and-hold circuit converts the pulsed voltage signal into a steady analog voltage output 506.

Figure 8:
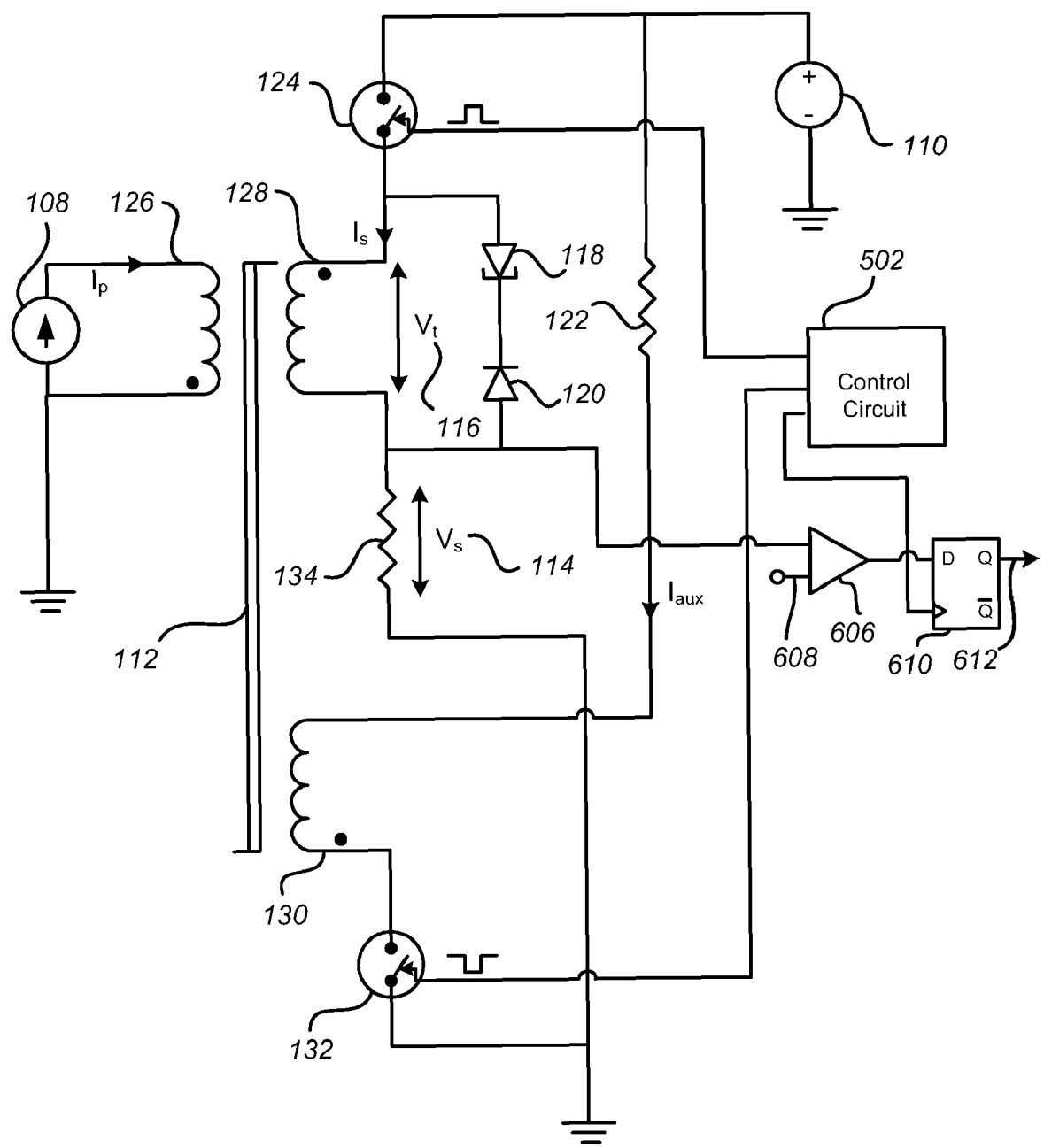
FIG. 8 is a schematic diagram of a fifth embodiment of the present invention adapted to produce a digital overcurrent indicator signal.

FIG. 8 illustrates a fifth embodiment of a current sensor in accordance with the present invention. Here, the output circuit is configured to provide a digital output signal that changes state when the current being measured 108 exceeds a pre-set value. An analog comparator 606 is used to compare a reference voltage level 608 with the voltage 114 across the sense resistor 134. When the measured voltage 114 exceeds the reference voltage 608, the output of comparator 606 will change. Since the voltage 114 is available only during time $t_2$, a D-Q flip flop is used to capture the state of the comparator at the sample time 320 (see FIG. 5).

Figure 9:
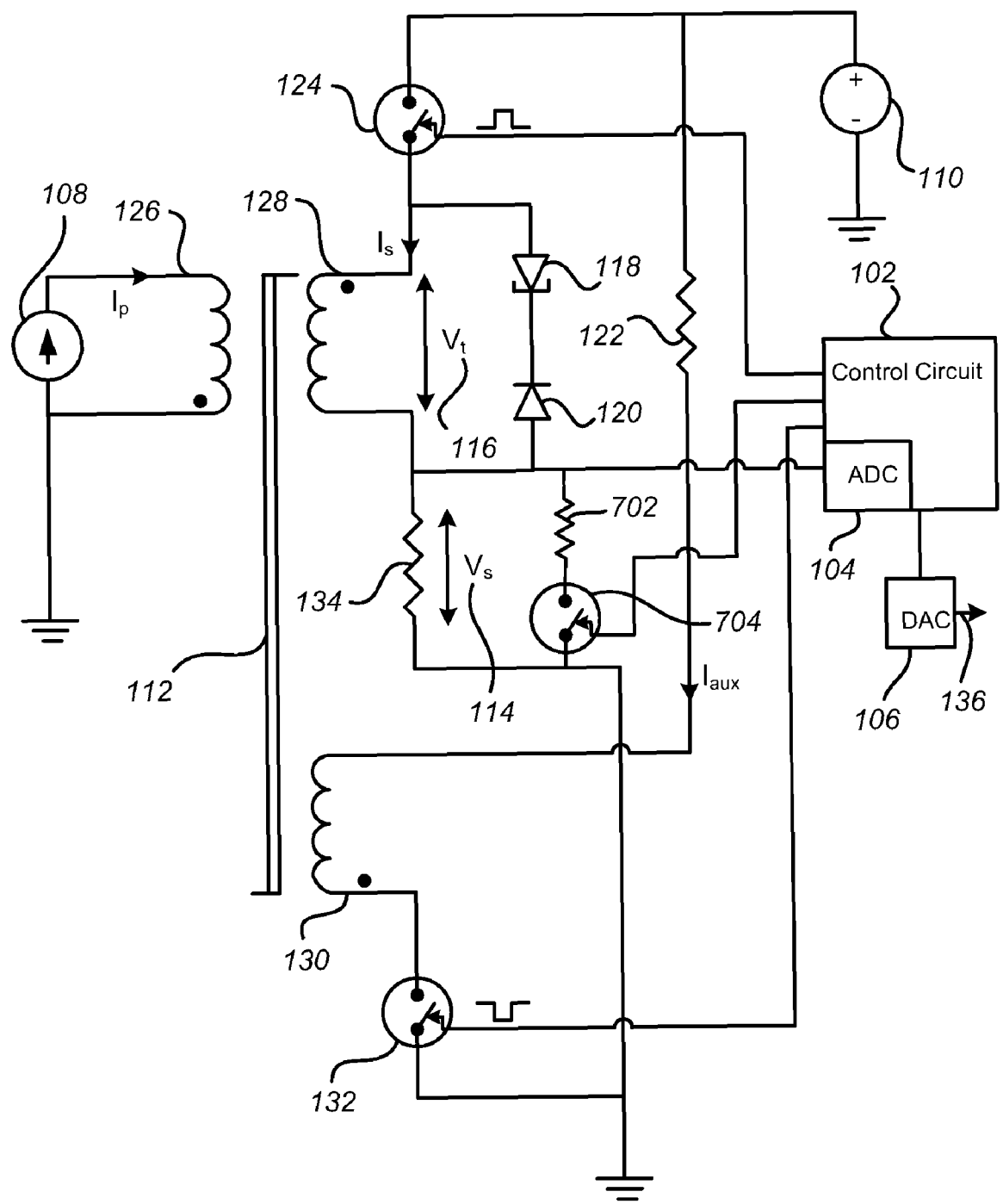
FIG. 9 is a schematic diagram of a sixth embodiment of the present invention adapted to measure currents in two selectable current ranges.

FIG. 9 illustrates sixth embodiment of the current sensor in accordance with the present invention. A range-select switch 704, is added to the circuit. When the control circuit 102 closes the range-select switch 704, a range-select resistor 702 is switched into the circuit parallel to the sense resistor 134, reducing the resistance between the secondary winding 128 and ground and correspondingly changing the voltage measured by the analog-to-digital converter 104. This allows the same analog-to-digital converter to be used for both high and low primary currents. Thus, at small primary currents, the voltage at the input to the analog-to-digital converter can be stretched across the full resolution of the analog-to-digital converter by switching the range-select switch 704, allowing an increase in the dynamic range of the sensing circuit. Alternatively, the range-select switch allows a cheaper analog-to-digital converter with fewer bits of resolution to be employed and still maintain adequate resolution at low current levels. It is also possible to use more than one range-select switch to provide additional current measurement ranges. The range select switches can further be configured to operate on sense resistors placed in series. For example, a range-select switch could be used to bypass one of two series sense resistors in order to change the voltage appearing at the ADC.

Figure 10:
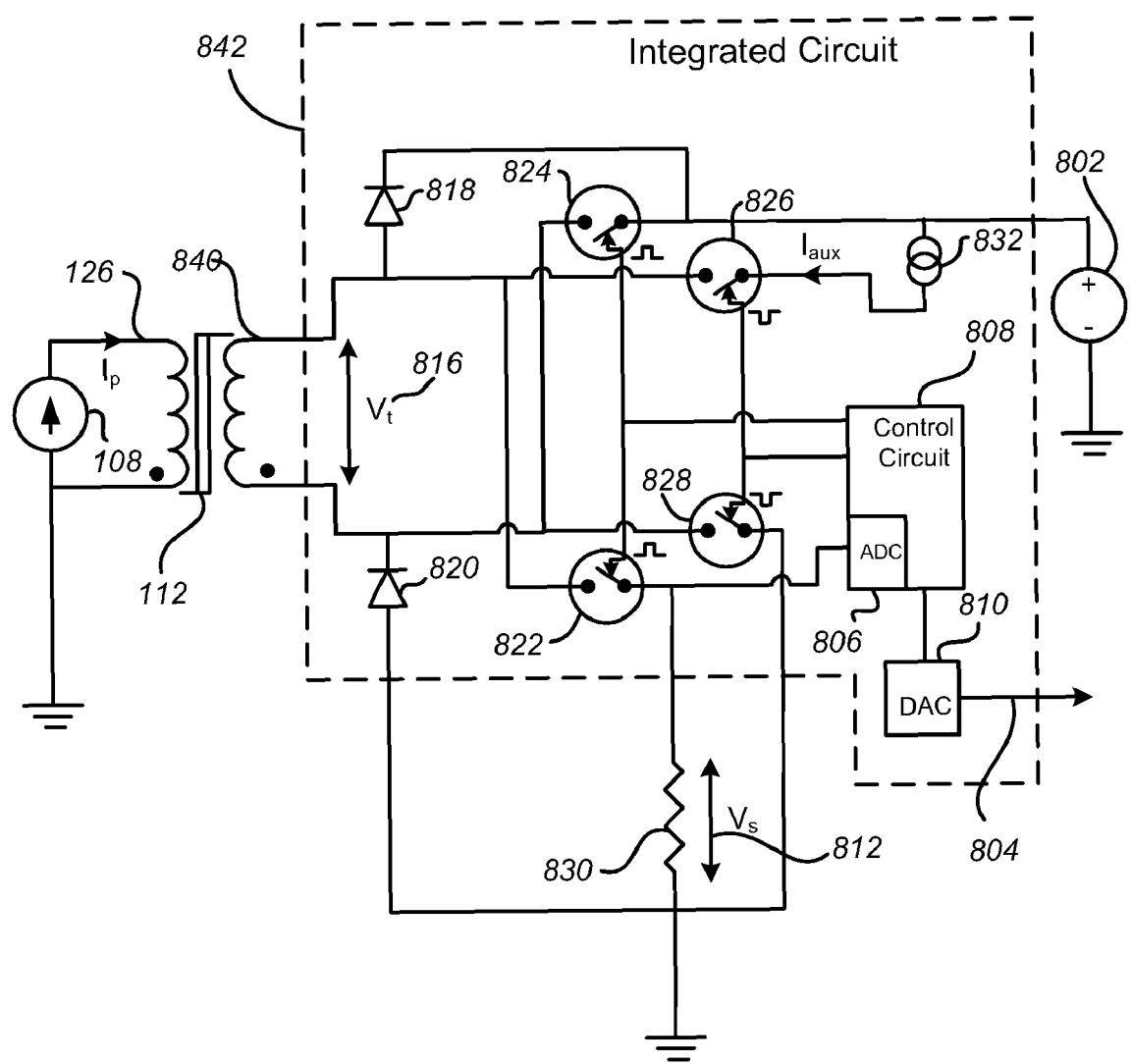
FIG. 10 is a schematic diagram of a seventh embodiment of the present invention adapted to use only a single winding to both saturate the magnetic core and sample the primary current.

FIG. 10 is a schematic diagram of a seventh embodiment of the present invention adapted to eliminate the auxiliary winding. Rather than employing a separate secondary winding and auxiliary winding, the circuit of this embodiment is adapted to use the secondary winding 840 both to saturate the core 112 and to sample the primary current 108. This embodiment is particularly well suited to integration within an application-specific integrated circuit, as indicated at 842. In this embodiment, two saturating switches 826 and 828 and two sampling switches 822 and 824 are required because the polarity of the secondary winding 840 must be changed between time periods $t_1$ and $t_2$ (see FIG. 5). Saturating switches 826 and 828 are closed together during the saturating time period in order to bring the core 112 into saturation. FIG. 10 shows the saturating current being supplied by a current source 832 rather than a resistor because such a current source is well suited to integration within an integrated circuit. However, it is also possible to use a resistor between saturating switch 828 and ground as an alternative. Once the core is brought to the operating point 202 (see FIG. 4), the saturating switches 826 and 828 are opened and the sampling switches 822 and 824 are closed. This causes a current proportional to the primary current 108 to flow through the secondary winding 840, and a voltage is developed across the sense resistor 830. This voltage is sampled by the ADC 806, or by another method such as those illustrated in the other embodiments. The sampling switches 822 and 824 are then opened and the magnetizing current begins to freewheel through diodes 818 and 820. Unlike in the other embodiments, this results in a voltage across the secondary winding given by:

$$V_t = V_{dc} - V_{d1} - V_{d2},$$

where $V_t$ 816 is the voltage across the secondary winding 840, $V_{dc}$ is the voltage of the power supply 802, $V_{d1}$ is the voltage drop across diode 818, and $V_{d2}$ is the voltage drop across diode 820.

An advantage of this embodiment is that the power loss is reduced by up to 50% over the embodiment shown in FIG. 3 because the power is recovered by the power source 802 rather than being dissipated in diodes 118 and 120. As pointed out previously, and as a feature of all the embodiments described in the present application, the secondary current during time interval $t_2$ 306 does not depend on the on-resistance of the sampling switches 822 and 824. Thus, the precision of the current measurement is solely dependent on the stability of the magnetizing current aroused by the magnetic core material.

One drawback of this seventh embodiment of the present invention is that it is not possible to measure bidirectional currents by maintaining both the saturating and sampling switches closed as described previously. This is because the auxiliary current cannot be provided during the sampling phase because it shares the same winding with the sampling circuit.

Figure 11:
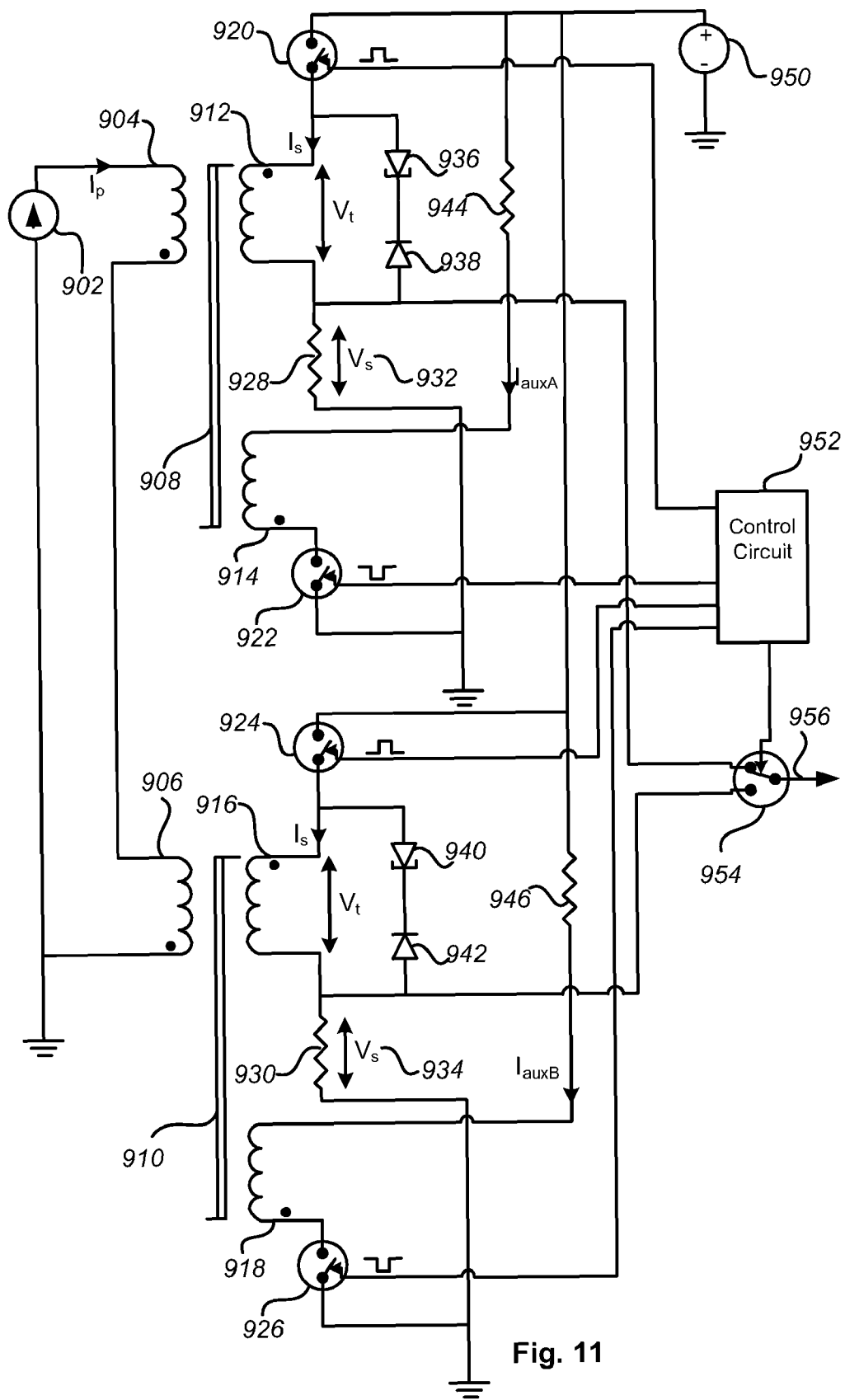
FIG. 11 is a schematic diagram of an eighth embodiment of the present invention adapted to provide a high-bandwidth continuous analog output signal.

FIG. 11 is a schematic diagram of an eighth embodiment of a current sensor in accordance with the present invention. In this embodiment, the current sensor is adapted to provide a continuous analog output signal, greatly increasing the bandwidth of the measurement system. This embodiment essentially combines two sensors under the control of a common control circuit 952. The sensor comprises two magnetic cores 908 and 910. A first primary winding 904 is wrapped around the first core 908, and a second primary winding 906 is wound around the second core 910. The primary current 902 passes through both primary windings. Each of the cores has its own secondary winding 912 and 916 in addition to an auxiliary winding 914 and 918. Further, each core has its own associated electronics including a first sense resistor 928 and a second sense resistor 930, a first saturating switch 922 and second saturating switch 926, and a first sampling switch 920 and second sampling switch 924. The control circuit 952 is adapted to control both measurement circuits as described above for the other alternative embodiments of the invention. The control circuit 952 is further adapted to operate each sampling switch with an on duty cycle that exceeds 50%, and it maintains the operation of the first sampling switch 920 to be approximately 180 degrees out of phase with the second sampling switch 924. Essentially, this results in the first sampling switch being closed whenever the second is open and vice versa. The control circuit 952 is also adapted to switch an output select switch 954 that selectively routes either the voltage across first sense resistor 928 or the voltage across second sense resistor 930 to the output 956. The control circuit 952 times the switching of the output select switch 954 to assure that the voltage output of the selected circuit is always valid at the time the output is switched. Thus, despite the fact that the sampling current in each magnetic core is pulsed in order to sample the primary current 902, the output 956 of the current sensor in FIG. 11 is continuous and tracks the primary current 902 at very high bandwidth.

Figure 12:
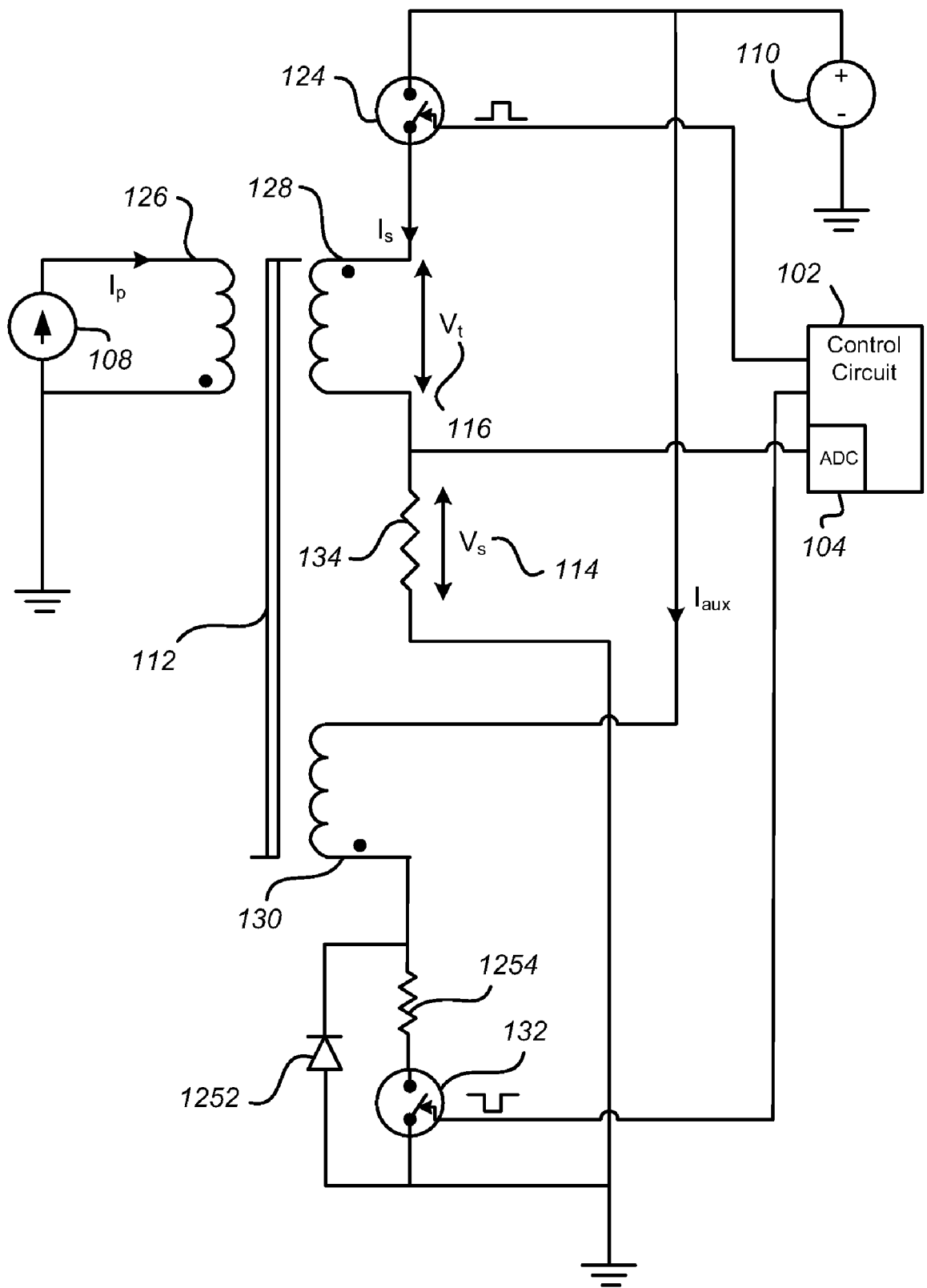
FIG. 12 is a schematic diagram of a ninth embodiment of the present invention adapted to significantly reduce the power loss.

FIG. 12 is a schematic diagram of a ninth embodiment of a current sensor in accordance with the present invention. The aim of this embodiment is to significantly reduce the power losses by adapting the auxiliary winding 130 to recover the energy during time interval $t_{off}$ 336 shown in FIG. 5. The diodes across the secondary winding 128 are omitted, thus urging the current to flow through diode 1252 during time interval $t_{off}$ 336. Apart from the small power loss in diode 1252 due to the forward drop voltage, the current flowing during time interval $t_{off}$ 336 is fully recovered into the power source 110. The control scheme and operating principle of this embodiment is the same as described in FIG. 5. In contrast to other embodiments described herein, the voltage $V_t$ 116 during time interval $t_{off}$ 336 is determined by the voltage of the power source 110 multiplied by the turns ratio of auxiliary winding 130 to the secondary winding 128.

Having thus described several embodiments of an isolated current sensor, it should be apparent to those skilled in the art that certain advantages of the invention have been achieved. It should also be appreciated that various modifications, adaptations, and alternative embodiments thereof may be made within the scope and spirit of the present invention. The invention is further defined by the following claims.

What is claimed is:

1. A current sensor comprising:
  a transformer having a primary winding, a secondary winding, and a substantially annular magnetic transformer core through which passes the primary winding and the secondary winding, wherein:
    the primary winding is adapted to carry a current to be measured; and
    the secondary winding is adapted to selectively carry a saturating current for inducing a saturating field in the magnetic transformer core, and to selectively carry a sampling current for inducing a field opposing the saturating field in the magnetic transformer core;
  a power source for selectively supplying current to the secondary winding;
  a sensing circuit adapted to measure a voltage that is substantially proportional to the magnitude of the current to be measured; and
  a control circuit adapted to selectively apply the saturating current to the secondary winding and to selectively apply the sampling current to the secondary winding.

2. The current sensor of claim 1, wherein the control circuit is further adapted to turn off the saturating current before applying the sampling current to the secondary winding and to turn off the sampling current before applying the saturating current to the secondary winding.

3. The current sensor of claim 1, wherein the secondary winding is further divided into a sampling winding and an auxiliary winding, and wherein the control circuit is adapted to apply the saturating current to the auxiliary winding, and to apply the sampling current to the sampling winding.

4. The current sensor of claim 3, wherein the control circuit is further adapted to first apply the saturating current to the auxiliary winding; to then apply the sampling current to the sampling winding such that both the saturating current and the sampling current are flowing at the same time; and to then turn off both the sampling current and the saturating current at substantially the same time.

5. The current sensor of claim 3, wherein the control circuit is further adapted to permit energy to flow from the auxiliary winding back to the power source when the control circuit turns off the sampling current.

6. The current sensor of claim 1, wherein the control circuit comprises at least one of a field-programmable gate array (FPGA), an application-specific integrated circuit (ASIC), a microcontroller, a digital signal processor (DSP), and a circuit comprising discrete digital logic components.

7. The current sensor of claim 1, wherein the control circuit comprises an analog circuit.

8. The current sensor of claim 1, wherein the sensing circuit comprises a sample-and-hold circuit adapted to receive a timing pulse from the control circuit.

9. The current sensor of claim 8, wherein the sensing circuit further comprises an analog-to-digital converter adapted to receive control signals from the control circuit.

10. The current sensor of claim 9, wherein the sensing circuit further comprises a digital-to-analog converter adapted to produce an analog voltage output.

11. The current sensor of claim 1, wherein the sensing circuit comprises:
  a sense resistor;
  an analog voltage reference;
  an analog comparator adapted to compare a voltage developed across the sense resistor with the analog voltage reference; and
  a latching circuit adapted to receive a data signal from the analog comparator and a timing signal from the control circuit.

12. The current sensor of claim 1, further comprising:
  at least a first sense resistor and a second sense resistor;
  at least one range-select switch adapted to selectively connect the second sense resistor in parallel with the first sense resistor;
  wherein the control circuit is further adapted to selectively open and close the at least one range-select switch.

13. The current sensor of claim 1, further comprising:
at least a first sense resistor and a second sense resistor wherein the first sense resistor is disposed in series with the second sense resistor; and
at least one range-select switch adapted to selectively bypass the second sense resistor;
wherein the control circuit is further adapted to selectively open and close the at least one range-select switch.

14. The current sensor of claim 1, wherein the primary winding comprises a single conductor that passes once through the substantially annular magnetic transformer core.

15. The current sensor of claim 1, wherein the magnetic transformer core comprises at least one of an amorphous alloy, a nanocrystalline alloy, a ferrite material, a permalloy, and a supermalloy.

16. The current sensor of claim 1, wherein the magnetic transformer core comprises a core that is plated on a substrate.

17. A current sensor comprising:
a transformer having a primary winding, an auxiliary winding, a secondary winding, and a substantially annular magnetic transformer core through which passes the primary winding, the auxiliary winding, and the secondary winding, wherein:
the primary winding is adapted to carry a current to be measured;
the auxiliary winding is adapted to carry a saturating current for selectively inducing a saturating field in the magnetic transformer core; and
the secondary winding is adapted to carry a sampling current for selectively inducing a field in the magnetic transformer core opposing the saturating field induced by the saturating current;
a power source for selectively supplying current to the auxiliary winding and to the secondary winding;
a saturating switch operatively coupled to the auxiliary winding for selectively connecting the auxiliary winding to the power source;
a sampling switch operatively coupled to the secondary winding for selectively connecting the secondary winding to the power source;
a sense resistor operatively connected in series with the secondary winding;
a sensing circuit adapted to measure a voltage developed across the sense resistor wherein the sensing circuit comprises a sample-and-hold circuit and an analog-to-digital converter; and
a digital control circuit adapted to selectively open and close the saturating switch and the sampling switch and to send control signals to the sample-and-hold circuit and to the analog-to-digital converter.

18. The current sensor of claim 17, wherein the control circuit is further adapted to permit energy to flow from the auxiliary winding back to the power source when the control circuit turns off the sampling current.

19. The current sensor of claim 17, wherein the control circuit comprises at least one of a field-programmable gate array (FPGA), an application-specific integrated circuit (ASIC), a microcontroller, a digital signal processor (DSP), and a circuit comprising discrete digital logic components.

20. The current sensor of claim 17, wherein the sensing circuit further comprises a digital-to-analog converter adapted to produce an analog voltage output.

21. The current sensor of claim 17, further comprising:
at least one range-select resistor; and
at least one range-select switch adapted to selectively connect the at least one range-select resistor in parallel with the sense resistor;
wherein the control circuit is further adapted to selectively open and close the at least one range-select switch.

22. The current sensor of claim 17, further comprising:
at least one range-select resistor disposed in series with the sense resistor; and
at least one range-select switch adapted to selectively bypass the at least one range-select resistor;
wherein the control circuit is further adapted to selectively open and close the at least one range-select switch.

23. The current sensor of claim 17, wherein the primary winding comprises a single conductor that passes once through the substantially annular magnetic transformer core.

24. The current sensor of claim 17, wherein the magnetic transformer core comprises at least one of an amorphous alloy, a nanocrystalline alloy, a ferrite material, a permalloy, and a supermalloy.

25. The current sensor of claim 17, wherein the magnetic transformer core comprises a core that is plated on a substrate.

26. A current sensor comprising:
a first transformer having a first primary winding, a first secondary winding, and a first substantially annular magnetic transformer core through which passes the first primary winding and the first secondary winding, wherein:
the first primary winding is adapted to carry a current to be measured; and
the first secondary winding is adapted to selectively carry a first saturating current for inducing a first saturating field in the first magnetic transformer core, and to selectively carry a first sampling current for inducing a field opposing the first saturating field in the first magnetic transformer core;
a second transformer having a second primary winding, a second secondary winding, and a second substantially annular magnetic transformer core through which passes the second primary winding and the second secondary winding, wherein:
the second primary winding is adapted to carry the current to be measured; and
the second secondary winding is adapted to selectively carry a second saturating current for inducing a second saturating field in the second magnetic transformer core, and to selectively carry a second sampling current for inducing a field opposing the second saturating field in the second magnetic transformer core;
a first sensing circuit adapted to measure a voltage that is substantially proportional to the magnitude of the current flowing in the first primary winding; and
a second sensing circuit adapted to measure a voltage that is substantially proportional to the magnitude of the current flowing in the second primary winding; and
a control circuit adapted to switch an output-selection switch and to selectively apply the first sampling current to the first secondary winding and the second sampling current to the second secondary winding, such that:
at least one of the first sampling current and the second sampling current is always flowing; and
the output-selection switch selects the first sensing circuit when the first sampling current is flowing and selects the second sensing circuit when the second sampling current is flowing.

27. The current sensor of claim 26, wherein:
the first secondary winding is further divided into a first sampling winding and a first auxiliary winding;

the second secondary winding is further divided into a second sampling winding and a second auxiliary winding; and the control circuit is further adapted to:
- apply the first saturating current to the first auxiliary winding;
- apply the first sampling current to the first sampling winding;
- apply the second saturating current to the second auxiliary winding; and
- apply the second sampling current to the second sampling winding.

28. The current sensor of claim 26 wherein the control circuit comprises at least one of a field-programmable gate array (FPGA), an application-specific integrated circuit (ASIC), a microcontroller, a digital signal processor (DSP), and a circuit comprising discrete digital logic components.

29. The current sensor of claim 26, wherein the sensing circuit further comprises a digital-to-analog converter adapted to produce an analog voltage output.

30. In a system comprising a signal to be measured and a current sensor comprising a power source and substantially annular magnetic transformer core through which passes a primary winding and a secondary winding, a method of measuring the signal comprises:
- routing the signal to be measured through the primary winding;
- pulsing a saturating current through the secondary winding;
- pulsing a sampling current through the secondary winding; and
- measuring the sampling current through the secondary winding to determine the magnitude of the signal to be measured.

31. The method of claim 30, further comprising controlling the timing of the saturating current pulse and the sampling current pulse such that they do not overlap to enable measurement of a signal comprising a unidirectional current.

32. The method of claim 30, further comprising controlling the timing of the saturating current pulse and the sampling current pulse such that the saturating current pulse envelopes the sampling current pulse to enable measurement of a signal comprising a bidirectional current.

33. The method of claim 30, further comprising connecting the signal to be measured through a resistor to the primary winding to enable measurement of a signal comprising a voltage.

34. The method of claim 30, further comprising digitizing the measurement of the sampling current using an analog-to-digital converter.

35. The method of claim 34, further comprising applying digital corrections to the digitized measurement of the sampling current to compensate for at least one of temperature and power source voltage variations.

36. The method of claim 30, further comprising recapturing energy in the secondary winding by routing the energy back to the power source when the sampling current is turned off.

* * * * *